(12) United States Patent
Houston et al.

(10) Patent No.: US 8,159,863 B2
(45) Date of Patent: Apr. 17, 2012

(54) 6T SRAM CELL WITH SINGLE SIDED WRITE

(75) Inventors: Theodore W. Houston, Richardson, TX (US); Anand Seshadri, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 237 days.

(21) Appl. No.: 12/782,874

(22) Filed: May 19, 2010

(65) Prior Publication Data

US 2010/0296334 A1  Nov. 25, 2010

Related U.S. Application Data

(60) Provisional application No. 61/180,297, filed on May 21, 2009.

(51) Int. Cl.
*G11C 11/00* (2006.01)

(52) U.S. Cl. .................. 365/156; 365/154; 365/189.14; 365/189.11

(58) Field of Classification Search .................. 365/154, 365/156, 189.14, 189.11, 230.06
See application file for complete search history.

(56) References Cited

U.S. PATENT DOCUMENTS 7,123,504 B2 * 10/2006 Yabe .............................. 365/156

* cited by examiner

*Primary Examiner* — David Lam
(74) *Attorney, Agent, or Firm* — Rose Alyssa Keagy; Wade J. Brady, III; Frederick J. Telecky, Jr.

(57) ABSTRACT

An SRAM cell containing an auxiliary driver transistor is configured for a single sided write operation. The auxiliary driver transistor may be added to a 5-transistor single-sided-write SRAM cell or to a 7-transistor single-sided-write SRAM cell. The SRAM cell may also include a read buffer. During read operations, the auxiliary drivers are biased. During write operations, the auxiliary drivers in half-addressed SRAM cells are biased and the auxiliary drivers in the addressed SRAM cells may be floated or biased.

20 Claims, 21 Drawing Sheets

6T SRAM CELL WITH SINGLE SIDED WRITE

CROSS-REFERENCE TO RELATED APPLICATIONS

This application claims the benefit of priority under U.S.C. §119(e) of U.S. Provisional Application 61/180,297 and entitled "6T SRAM Cell with Single Sided WRITE"), filed May 21, 2009, the entirety of which is incorporated herein by reference.

Furthermore, this application is related to:
patent application Ser. No. 12/782,908 entitled "8T SRAM Cell With Four Load Transistors,"
patent application Ser. No. 12/782,894 entitled "Asymmetric SRAM Cell With Split Transistors On The Strong Side,"
patent application Ser. No. 12/782,902 entitled "8T SRAM Cell With Two Single-Sided Ports,"
patent application Ser. No. 12/782,941 entitled "8T SRAM Cell With One Word Line," and
patent application Ser. No. 12/782,927 entitled "SRAM Cell For Single Sided Write."

With their mention in this section, these patent applications are not admitted to be prior art with respect to the present invention; patent application Ser. No. 12/782,874.

FIELD OF THE INVENTION

This invention relates to the field of integrated circuits. More particularly, this invention relates to static random access memories (SRAMs) configured for single sided write operations.

DETAILED DESCRIPTION

Figure 1:
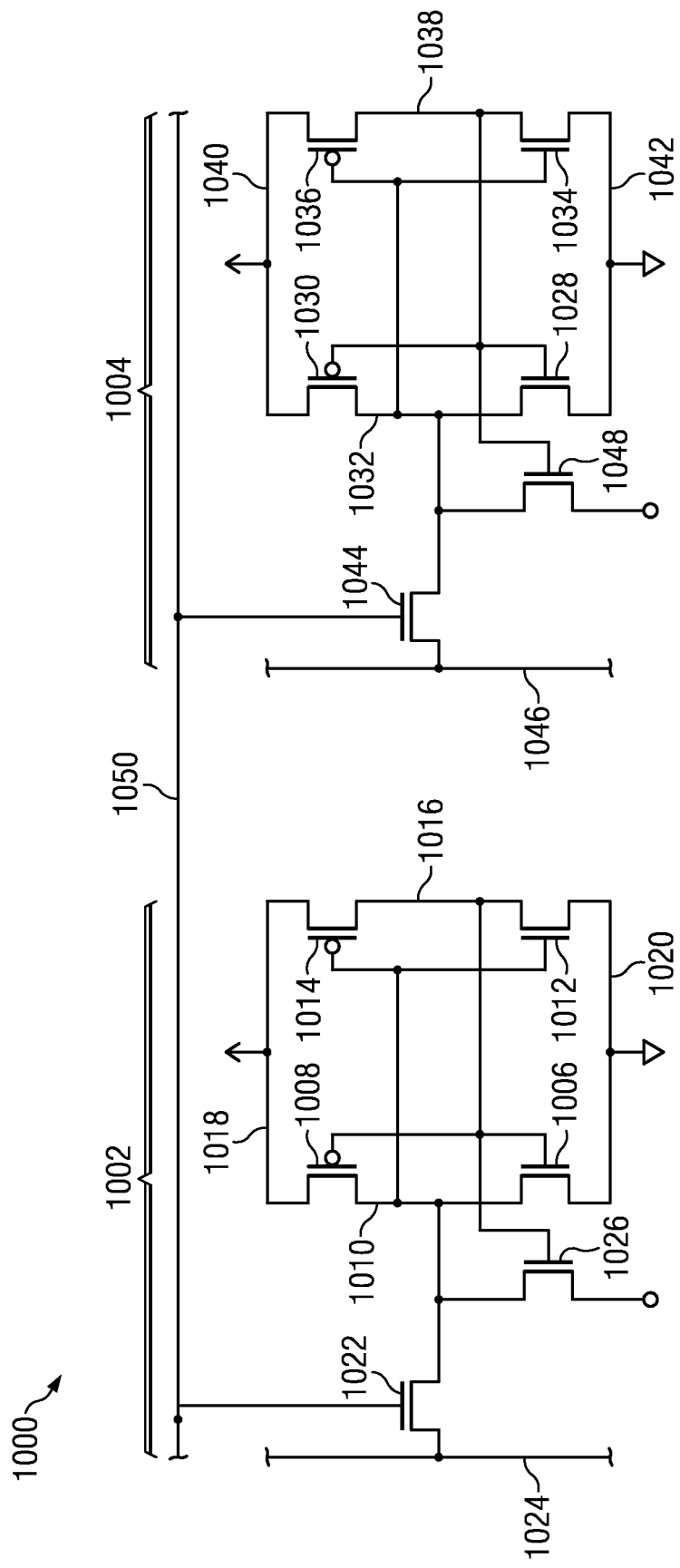
FIG. 1 is a circuit diagram of SRAM cells formed according to a first embodiment.

Example embodiments are described with reference to the attached figures, wherein like reference numerals are used throughout the figures to designate similar or equivalent elements. The figures are not drawn to scale and they are provided merely to illustrate the example embodiment. Several aspects are described below with reference to example applications for illustration. It should be understood that numerous specific details, relationships, and methods are set forth to provide a full understanding of the example embodiments. One skilled in the relevant art, however, will readily recognize that the embodiments can be practiced without one or more of the specific details or with other methods. In other instances, well-known structures or operations are not shown in detail to avoid obscuring the example embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

For the purposes of this description, the term "Vdd" is understood to refer to a power supply node with a voltage level suitable for source nodes of p-channel metal oxide semiconductor (PMOS) transistors. Similarly, the term "Vss" is understood to refer to a power supply node with a voltage level suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode, so as to limit charge accumulation or voltage excursion.

For the purposes of this description, the term "Vtn" is understood to mean an average threshold voltage of NMOS transistors in inverters of SRAM cells. The term "Vtp" is understood to mean an average threshold voltage magnitude of PMOS transistors in inverters of SRAM cells.

In this disclosure, the term "driver transistor" is understood to refer to a metal oxide semiconductor (MOS) transistor, possibly a finFET transistor, or possibly a is connected to a data node. A gate node of the driver transistor is connected to an opposite data node from the driver drain node. A source node of the driver transistor is connected to a power supply node, typically either Vdd for PMOS driver transistors or Vss for NMOS driver transistors. A polarity of the driver transistor source node power supply is commonly opposite a polarity of a read operation pre-charge voltage level of a corresponding data line which is connected to the driver transistor through a passgate transistor. That is, SRAM cells in arrays which pre-charge data lines to a high voltage commonly have NMOS driver transistors, while SRAM cells in arrays which pre-charge data lines to a low voltage commonly have PMOS driver transistors.

Similarly, the term "load transistor" is understood to refer to another MOS transistor, possibly a finFET transistor, or possibly a CNT, in the SRAM cell. A drain node of the load transistor is connected to a data node. A gate node of the load transistor is connected to an opposite data node from the load drain node. A source node of the load transistor is connected to a power supply node, typically either Vdd for PMOS load transistors or Vss for NMOS load transistors. A polarity of the load transistor source node power supply is commonly the same as the polarity of a read operation pre-charge voltage level of a corresponding data line which is connected to the driver transistor through a passgate transistor. That is, SRAM cells in arrays which pre-charge data lines to a high voltage commonly have PMOS load transistors, while SRAM cells in arrays which pre-charge data lines to a low voltage commonly have NMOS load transistors.

The term "passgate transistor" is understood to refer to yet another MOS transistor, possibly a finFET transistor, or possibly a CNT, in the SRAM cell. One source/drain node is connected to a data node and an opposite source/drain node connected to a corresponding data line of the SRAM cell. Similarly, the term "access transistor" is understood to refer to an MOS transistor in the SRAM cell. One source/drain node is connected to a data node and an opposite source/drain node is connected to a read buffer transistor. For the purposes of this description, use of the term passgate transistor will be distinguished from use of the term access transistor by a convention in which passgate transistors are never connected to read buffer transistors while access transistors are always connected to read buffer transistors.

For the purposes of this description, the term "bit-side" is understood to refer to components such as a driver transistor, load transistor and passgate transistor connected to a data node in an SRAM cell. Similarly, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this description, the term "addressed SRAM cell" is understood to refer to an SRAM cell in which a passgate transistor is turned on, and a bit line is connected to read circuitry or write circuitry. The term "half-addressed SRAM cell" is understood to refer to an SRAM cell in which a passgate transistor is turned on, while any bit line is disconnected from read or write circuitry.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays, the integrated circuits also contain microprocessors, digital signal processors and wireless telephony controllers, circuits which provide data to be stored in the SRAM array and circuits which use data from the SRAM array.

An example embodiment provides an SRAM cell configured for a single sided write operation containing an auxiliary driver transistor on the node connected to the write passgate transistor. NMOS auxiliary driver transistors are added to SRAM cells in which bit lines are pre-charged high (near Vdd) prior to a read operation. Similarly, PMOS auxiliary driver transistors are added to SRAM cells in which bit lines are pre-charged low (near Vss) prior to a read operation. The auxiliary driver transistor may be added to a 5-transistor single-sided-write SRAM cell or to a 7-transistor single-sided-write SRAM cell which includes a read buffer.

During write operations, source nodes of the auxiliary driver transistors in addressed SRAM cells may be floated to reduce interference with data transfer from bit lines to the addressed SRAM cells. The source nodes may be connected to Vss or Vdd, as appropriate, to assist data transfer from the bit lines to data nodes in the addressed SRAM cells. Source nodes of the auxiliary driver transistors in half-addressed SRAM cells are connected to Vss or Vdd, as appropriate, to reduce data inversion as passgate transistors are turned on during the single sided write operations.

During read operations, source nodes of the auxiliary driver transistors in addressed SRAM cells are connected to Vss and Vdd, as appropriate, to improve static noise margin values in the addressed SRAM cells. Source nodes of the auxiliary driver transistors in half-addressed SRAM cells are connected to Vss and Vdd, as appropriate, to reduce data inversion as passgate transistors are turned on during the read operations.

In standby modes, source nodes of the auxiliary driver transistors are floated to reduce leakage current in the SRAM cells.

FIG. 1 is a circuit diagram of SRAM cells formed according to a first embodiment. An integrated circuit contains an SRAM cell array (1000) further containing a first SRAM cell (1002) and a second SRAM cell (1004). The first SRAM cell (1002) includes an NMOS first bit-side driver transistor (1006) commonly known as a first bit driver (1006) and a PMOS first bit-side load transistor (1008) commonly known as a first bit load (1008). A drain node of the first bit driver (1006) and a drain node of the first bit load (1008) are connected to a first bit-side data node (1010). The first SRAM cell (1002) also includes an NMOS first bit-bar-side driver transistor (1012) commonly known as a first bit-bar driver (1012) and a PMOS first bit-bar-side load transistor (1014) commonly known as a first bit-bar load (1014). A drain node of the first bit-bar driver (1012) and a drain node of the first bit-bar load (1014) are connected to a first bit-bar-side data node (1016). A source node of the first bit load (1008) and a source node of the first bit-bar load (1014) are connected to a first Vdd node (1018). A source node of the first bit driver (1006) and a source node of the first bit-bar driver (1012) are connected to a first Vss node (1020). A gate node of the first bit driver (1006) and a gate node of the first bit load (1008) are connected to the first bit-bar-side data node (1016). Similarly, a gate node of the first bit-bar driver (1012) and a gate node of the first bit-bar load (1014) are connected to the first bit-side data node (1010). The first bit driver (1006), the first bit load (1008) and the first bit-side data node (1010) form a first bit inverter. Similarly, the first bit-bar driver (1012), the first bit-bar load (1014) and the first bit-bar-side data node (1016) form a first bit-bar inverter. The configuration of connecting gate nodes of the first bit inverter to the first bit-bar-side data node (1016) and connecting gate nodes of the first bit-bar inverter to the first bit-side data node (1010) is known as cross-coupled inverters.

The first SRAM cell (1002) also includes a first passgate transistor (1022) commonly known as a first passgate (1022). The first passgate (1022) may be an NMOS transistor as depicted in FIG. 1, but may possibly be a PMOS transistor or other switching mechanism. A first source/drain node of the first passgate (1022) is connected to the first bit-side data node (1010) and a second source/drain node of the first passgate (1022) is connected to a first bit line (1024). In one embodiment, an on-state current of the first passgate transistor (1022) is between 100 percent and 200 percent of an on-state current of the first bit driver (1006).

The first SRAM cell (1002) also includes an NMOS first auxiliary driver transistor (1026). A drain node of the first auxiliary driver transistor (1026) is connected to the first bit-side data node (1010). A gate node of the first auxiliary driver transistor (1026) is connected to the first bit-bar-side data node (1016). In one embodiment, an on-state current of the first auxiliary driver transistor (1026) is between 75 percent and 200 percent of an on-state current of the first passgate transistor (1022). In an alternate embodiment, the first auxiliary driver transistor (1026) may have a threshold voltage which is more than 50 millivolts lower than a threshold voltage of the first bit driver (1006). In a further embodiment, a sum of the on-state current of the first auxiliary driver transistor (1026) and the on-state current of the first bit driver (1006) may be higher than an on-state current of the first passgate transistor (1022).

Similarly, the second SRAM cell (1004) includes a second bit driver (1028) and a second bit load (1030); a drain node of the second bit driver (1028) and a drain node of the second bit load (1030) are connected to a second bit-side data node (1032). The second SRAM cell (1004) includes a second bit-bar driver (1034) and a second bit-bar load (1036); a drain node of the second bit-bar driver (1034) and a drain node of the second bit-bar load (1036) are connected to a second bit-bar-side data node (1038). A source node of the second bit load (1030) and a source node of the second bit-bar load (1036) are connected to a second Vdd node (1040). A source node of the second bit driver (1028) and a source node of the second bit-bar driver (1034) are connected to a second Vss node (1042). A gate node of the second bit driver (1028) and a gate node of the second bit load (1030) are connected to the second bit-bar-side data node (1038). A gate node of the second bit-bar driver (1034) and a gate node of the second bit-bar load (1036) are connected to the second bit-side data node (1032).

The second SRAM cell (1004) also includes a second passgate (1044). A first source/drain node of the second passgate (1044) is connected to the second bit-side data node (1032) and a second source/drain node of the second passgate (1044) is connected to a second bit line (1046). The second SRAM cell (1004) also includes a second auxiliary driver transistor (1048). A drain node of the second auxiliary driver transistor (1048) is connected to the second bit-side data node (1032). A gate node of the second auxiliary driver transistor (1048) is connected to the second bit-bar-side data node (1038).

A gate node of the first passgate (1022) and a gate node of the second passgate (1044) are connected to a word line (1050). It is common for the first bit line (1024) to be connected to passgates in other SRAM cells (not shown) in a same column as the first SRAM cell (1002). Similarly, it is common for the second bit line (1046) to be connected to passgates in other SRAM cells (not shown) in a same column as the second SRAM cell (1004). Furthermore, it is common for the word line (1050) to be connected to passgates in other SRAM cells (not shown) in a same row as the first SRAM cell (1002) and the second SRAM cell (1004).

In one embodiment, the driver transistors (1006, 1012, 1028, 1034) and the load transistors (1008, 1014, 1030, 1036) are a minimum width consistent with fabrication methods used to manufacture the SRAM array (1000). Minimizing driver and load transistor widths advantageously reduces a size of the SRAM array (1000) and reduces manufacturing costs per SRAM array.

In another embodiment, a threshold voltage of the first bit-bar driver (1012) may be between a product of Vdd minus Vss times a ratio of an on-state current of the first passgate (1022) to an on-state current of the first bit driver (1006) and a product of Vdd minus Vss times a ratio of the on-state current of the first passgate (1022) to a sum of the on-state current of the first bit driver (1006) and an on-state current of the first auxiliary driver transistor (1026), thereby possibly reducing leakage current in the first bit-bar driver (1012).

In an alternate embodiment, the driver transistors (1006, 1012, 1028, 1034), the load transistors (1008, 1014, 1030, 1036) and the auxiliary driver transistors (1026, 1048) may be finFET transistors. Forming the SRAM array (1000) with finFET transistors may advantageously reduce a size of the SRAM array (1000) and reduce manufacturing costs per SRAM array.

During an operation to perform a single sided write operation on the first SRAM cell (1002), the first SRAM cell (1002) is addressed for writing, and the second SRAM cell (1004) is half-addressed. The second bit line (1046) is pre-charged to a voltage level appropriate for maintaining data stability in half addressed SRAM cells, and then optionally floated. In one embodiment of a single sided write operation, the second bit line (1046) may be pre-charged to a voltage level higher than Vss plus Vtn. In an alternate embodiment, the second bit line (1046) may be pre-charged to a voltage level higher than Vdd minus Vtn.

A source node of the second auxiliary driver transistor (1048) is connected to a voltage level appropriate for maintaining data stability in half addressed SRAM cells. In one embodiment, the source node of the second auxiliary driver transistor (1048) may be biased to a voltage level less than Vdd minus Vtn. In an alternate embodiment, the source node of the second auxiliary driver transistor (1048) may be biased to a voltage level less than Vss plus Vtn. In a further embodiment, the source node of the second auxiliary driver transistor (1048) may be biased to a voltage level less than Vss.

The first bit line (1024) is connected to a voltage source appropriate for providing adequate write margin in an addressed SRAM cell. In one embodiment of a single sided write low operation, the first bit line (1024) may be biased to a voltage level below Vdd minus Vtn. In an alternate embodiment of a single sided write low operation, the first bit line (1024) may be biased to a voltage level below Vss plus Vtn. In one embodiment of a single sided write high operation, the first bit line (1024) may be biased to a voltage level above Vss plus Vtn. In an alternate embodiment of a single sided write high operation, the first bit line (1024) may be biased to a voltage level above Vdd minus Vtn.

A source node of the first auxiliary driver transistor (1026) may be floated or may be connected to a voltage level appropriate for providing adequate write margin in an addressed SRAM cell. In one embodiment of a single sided write low operation, the source node of the first auxiliary driver transistor (1026) may be biased to a voltage level below Vdd minus Vtn. In an alternate embodiment of a single sided write low operation, the source node of the first auxiliary driver transistor (1026) may be biased to a voltage level below Vss plus Vtn. In a further embodiment of a single sided write low operation, the source node of the first auxiliary driver transistor (1026) may be biased to a voltage level below Vss.

In one embodiment of a single sided write high operation, the source node of the first auxiliary driver transistor (1026) may be biased to a voltage level above Vss plus Vtn. In an alternate embodiment of a single sided write high operation, the source node of the first auxiliary driver transistor (1026) may be biased to a voltage level above Vdd minus Vtn. In a further embodiment of a single sided write high operation, the source node of the first auxiliary driver transistor (1026) may be biased to a voltage level above Vdd.

The word line (1050) is connected to a voltage source whereby the first passgate (1022) and the second passgate (1044) are turned on. In a successful write operation, a voltage level on the first bit line (1024) is transferred to the first bit-side data node (1010) and a desired voltage level on the first bit-side data node (1010) becomes stabilized.

Floating source nodes of auxiliary driver transistors in addressed SRAM cells during a single sided write operation may reduce write failures. In addition, biasing the source nodes may reduce write failures. (Write failures are write operations in which potentials on bit lines are not successfully transferred to bit-side data nodes and stabilized.)

Furthermore, biasing source nodes of auxiliary driver transistors in half-addressed SRAM cells during a single sided write operation may reduce data upsets in the half addressed SRAM cells. Data upsets are events in which data bits stored in SRAM cells become inverted, for example a "1" value is changed to a "0" value and vice versa.

Figure 2A:
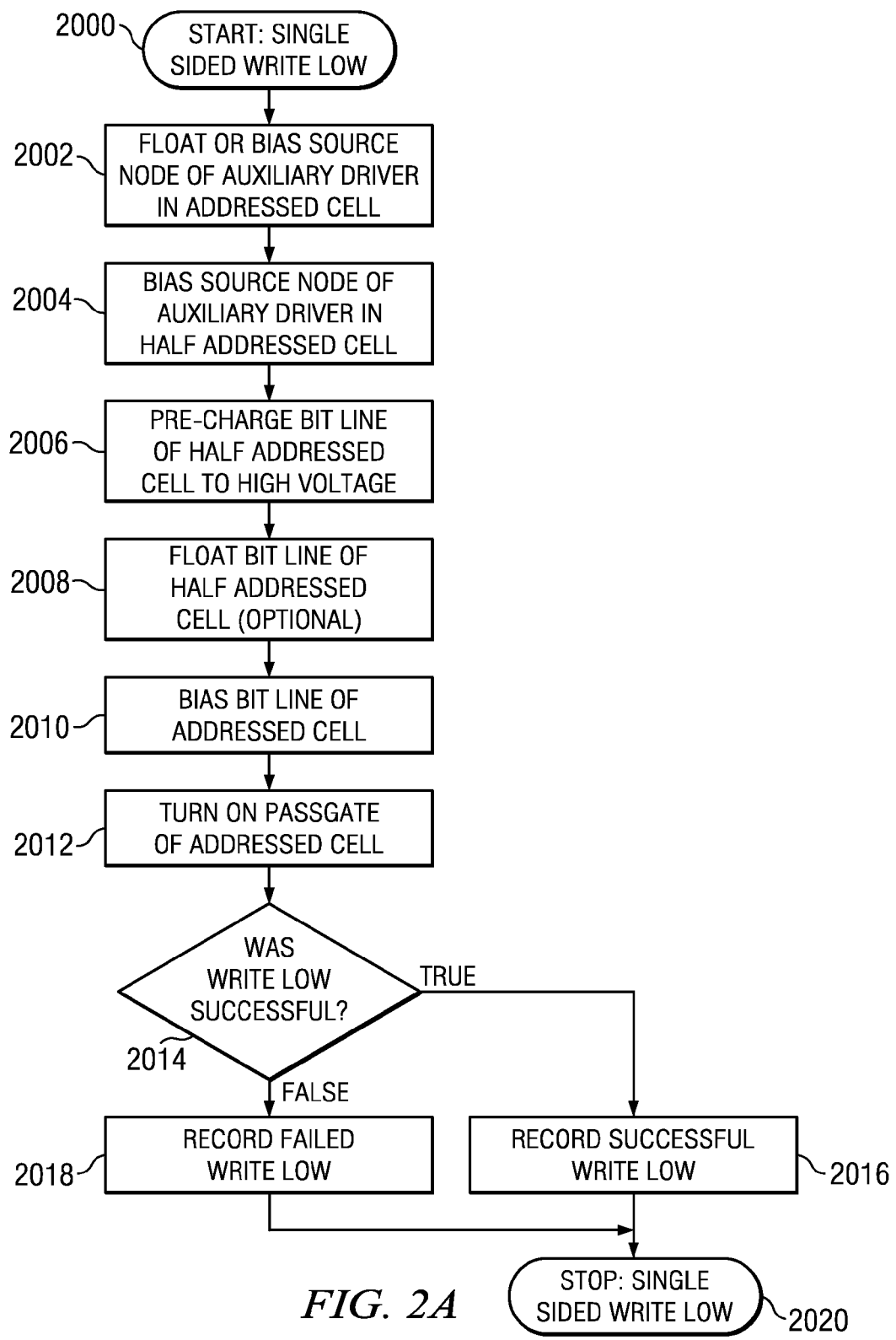
FIG. 2A through FIG. 2D are flowcharts of a first data bit value write operation, a second data bit value write operation, a read operation, and a transition to standby mode, respectively, for the first embodiment.

FIG. 2A through FIG. 2D are flowcharts of a single sided write low operation, a single sided write high operation, a read operation, and a transition to standby mode, respectively. The flowcharts in FIG. 2A through FIG. 2D refer to the SRAM array depicted in FIG. 1. Referring to FIG. 2A, the single sided write low operation begins (2000) with step (2002) which is to float or bias the source node of the auxiliary driver (1026) in the addressed SRAM cell (1002) to improve a write low margin in the addressed SRAM cell (1002). Next, step (2004) is to bias the source node of the auxiliary driver (1048) in the half addressed SRAM cell (1004) to improve a static noise margin value in the half addressed SRAM cell (1004). Subsequently, step (2006) is to pre-charge the bit line (1046) of the half addressed SRAM cell (1004) to a high voltage. Then, step (2008) is to optionally float the bit line (1046) of the half addressed SRAM cell (1004). Next, step (2010) is to bias the bit line (1024) of the addressed SRAM cell (1002) to a low voltage. Subsequently, step (2012) is to turn on the passgate (1022) of the addressed SRAM cell (1002). During a test mode of the single sided write low operation, step (2014) is to determine if a low voltage was successfully transferred to the bit-side data node (1010) in the addressed SRAM cell (1002) and if a data upset occurred in the half-addressed SRAM cell (1004). If the low voltage was successfully transferred and no data upset occurred, step (2016) is to record a successful single sided write low operation for the addressed SRAM cell (1002). If the low voltage was not successfully transferred or a data upset occurred, step (2018) is to record a failed single sided write low operation for the addressed SRAM cell (1002). Next, the single sided write low operation is ended (2020). In an alternate embodiment, steps (2002), (2004), (2006) and (2010) may be performed in any order.

Figure 2B:
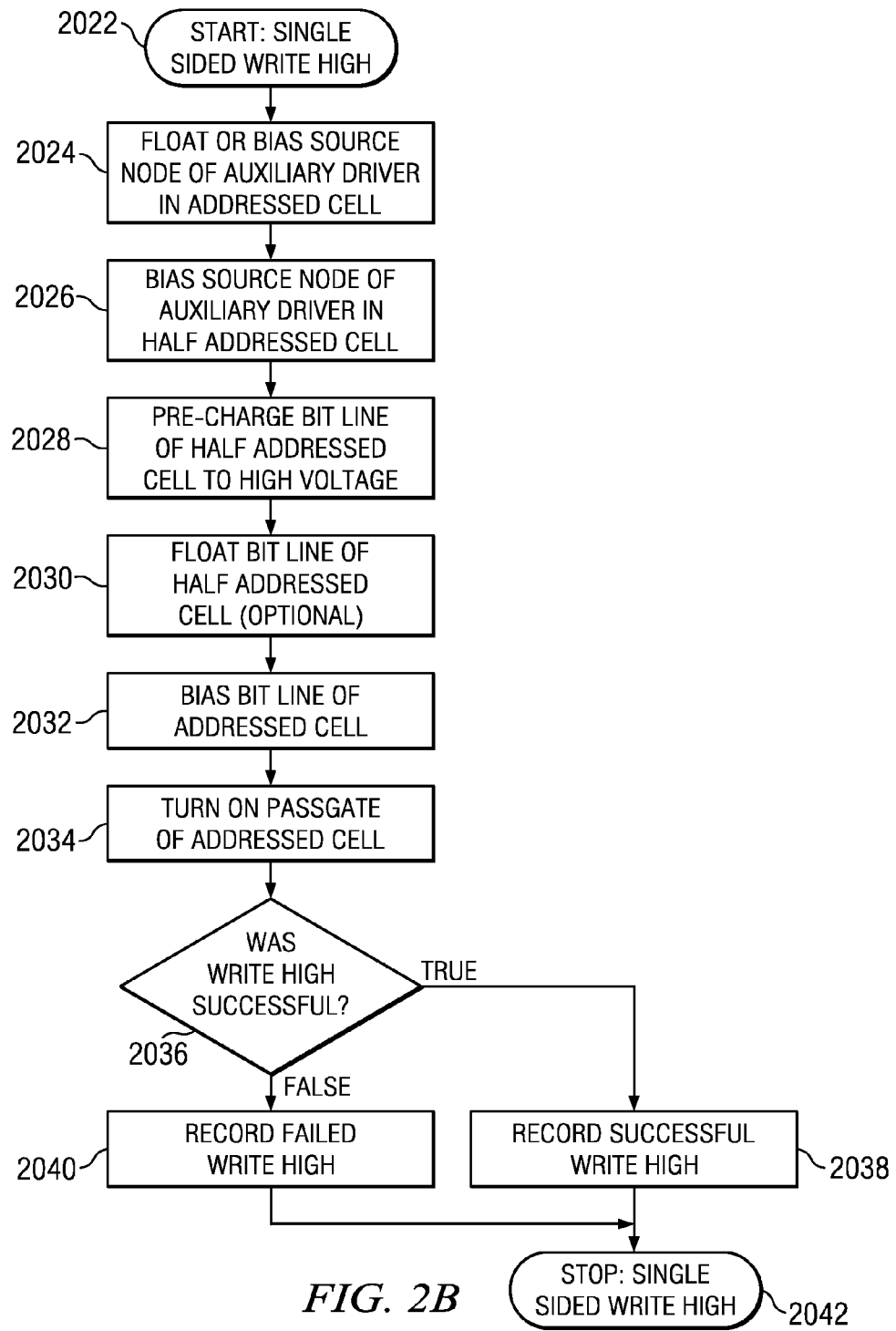

Referring to FIG. 2B, the single sided write high operation begins (2022) with step (2024) which is to float or bias the source node of an auxiliary driver (1026) in the addressed SRAM cell (1002) to improve a write high margin in the addressed SRAM cell (1002). Next, step (2026) is to bias the source node of the auxiliary driver (1048) in the half addressed SRAM cell (1004) to improve the static noise margin value in the half-addressed SRAM cell (1004). Subsequently, step (2028) is to pre-charge the bit line (1046) of the half addressed SRAM cell (1004) to a high voltage. Then, step (2030) is to optionally float the bit line (1046) of the half addressed SRAM cell (1004). Next, step (2032) is to bias the bit line (1024) of the addressed SRAM cell (1002) to a high voltage. Subsequently, step (2034) is to turn on the passgate (1022) of the addressed SRAM cell (1002). During a test mode of the single sided write low operation, step (2036) is to determine if a high voltage was successfully transferred to the bit-side data node (1010) in the addressed SRAM cell (1002) and if a data upset occurred in the half-addressed SRAM cell (1004). If the high voltage was successfully transferred and no data upset occurred, step (2038) is to record a successful single sided write high operation for the addressed SRAM cell (1002). If the high voltage was not successfully transferred or a data upset occurred, step (2040) is to record a failed single sided write high operation for the addressed SRAM cell (1002). Next, the single sided write high operation is ended (2042). In an alternate embodiment, steps (2024), (2026), (2028) and (2032) may be performed in any order.

Referring back to FIG. 1, during an operation to read a data bit value from the first SRAM cell (1002), the first SRAM cell (1002) is addressed for reading, and the second SRAM cell (1004) is half-addressed. The source node of the second auxiliary driver transistor (1048) is biased to a voltage level appropriate for maintaining data stability in half addressed SRAM cells, as recited with respect to the single sided write operation above in reference to FIG. 1.

The source node of the first auxiliary driver transistor (1026) is biased to a voltage level appropriate for providing adequate static noise margin in the addressed SRAM cell (1002). In one embodiment of a read operation, the source node of the first auxiliary driver transistor (1026) may be biased to a voltage level below Vdd minus Vtn. In an alternate embodiment, the source node of the first auxiliary driver transistor (1026) may be biased to a voltage level below Vss plus Vtn. In a further embodiment, the source node of the first auxiliary driver transistor (1026) may be biased to a voltage level below Vss.

The first bit line (1024) is pre-charged to a voltage level appropriate for a read operation, and is then optionally floated. In one embodiment of a read operation, the first bit line (1024) may be biased to a voltage level above Vss plus Vtn. In an alternate embodiment, the first bit line (1024) may be biased to a voltage level above Vdd minus Vtn.

The second bit line (1046) is typically also pre-charged to a voltage level appropriate for maintaining data stability in half addressed SRAM cells (such as 1004), and then optionally floated. In one embodiment of a read operation, the second bit line (1046) may be pre-charged to a voltage level higher than Vss plus Vtn. In an alternate embodiment, the second bit line (1046) may be pre-charged to a voltage level higher than Vdd minus Vtn.

The word line (1050) is connected to a voltage source whereby the first passgate (1022) and the second passgate (1044) are turned on. In a successful read operation, a voltage level on the first bit-side data node (1010) is transferred to the first bit line (1024). As a result, the data bit is available to other circuits (not shown) connected to the first bit line (1024) but located outside the SRAM array (1000) (such as a sense amplifier). A successful read operation also requires data values in half-addressed SRAM cells to be free of data upsets.

Biasing source nodes of auxiliary driver transistors in addressed SRAM cells as recited above during a read operation may reduce read failures. (Read failures are read operations in which potentials on bit-side data nodes are not successfully transferred to bit lines such that correct values of data bits from addressed SRAM cells are not detected by external circuitry.)

Furthermore, biasing source nodes of auxiliary driver transistors in half-addressed SRAM cells as recited above during a read operation may reduce data upsets in the half addressed SRAM cells.

Figure 2C:
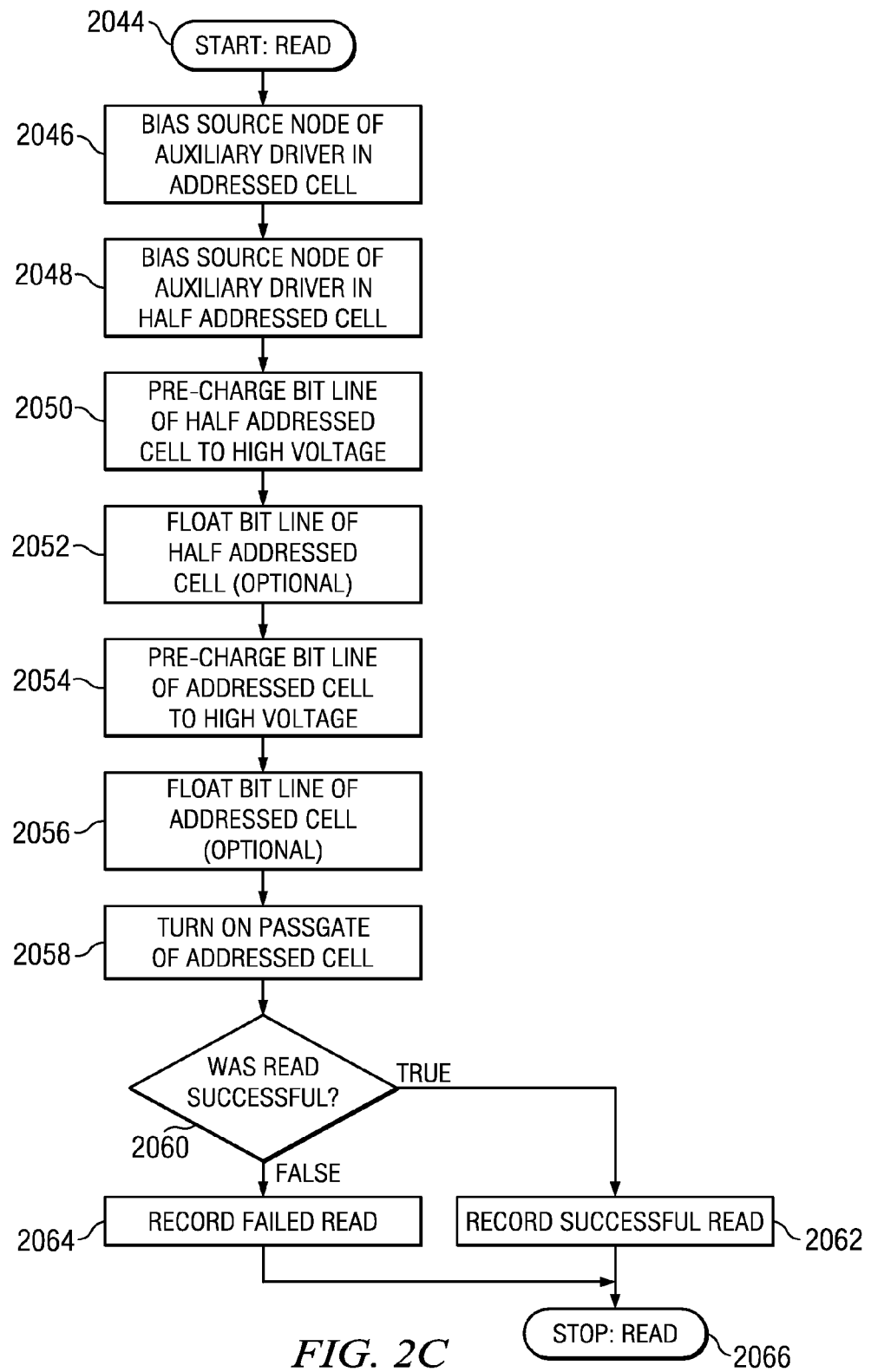

Referring to FIG. 2C, the read operation begins (2044) with step (2046) which is to bias the source node of an auxiliary driver (1026) in the addressed SRAM cell (1002) to improve a static noise margin value in the addressed SRAM cell (1002). Next, step (2048) is to bias the source node of the auxiliary driver (1048) in the half addressed SRAM cell (1004) to improve the static noise margin value in the half addressed SRAM cell (1004). Subsequently, step (2050) is to pre-charge the bit line (1046) of the half addressed SRAM cell (1004) to a high voltage. Then, step (2052) is to optionally float the bit line (1046) of the half addressed SRAM cell (1004). Subsequently, step (2054) is to pre-charge the bit line (1024) of the addressed SRAM cell (1002) to a high voltage. Next, step (2056) is to optionally float the bit line (1024) of the addressed SRAM cell (1002). Then, step (2058) is to turn on the passgate (1022) of the addressed SRAM cell (1002). During a test mode of the read operation, step (2060) is to determine if a voltage level on the bit-side data node (1010) was successfully transferred to the bit line (1024) and if a data upset occurred in the half-addressed SRAM cell (1004). If the voltage level was successfully transferred and if no data upset occurred, step (2062) is to record a successful read operation for the addressed SRAM cell (1002). If the voltage level on the bit-side data node was not successfully transferred or if a data upset occurred, step (2064) is to record a failed read operation for the addressed SRAM cell (1002). Next, the read operation is ended (2066). In an alternate embodiment, steps (2046), (2048), (2050) and (2054) may be performed in any order.

Referring back to FIG. 1, in a standby mode, that is, a condition in which read operations and write operations are not performed and power consumption is reduced in the SRAM array (1000), the source node of the first auxiliary driver transistor (1026) and the source node of the second auxiliary driver transistor (1048) are floated. The first bit line (1024) and the second bit line (1046) are floated. The word line (1050) is connected to a voltage source whereby the first passgate (1022) and the second passgate (1044) are turned off. Floating source nodes of auxiliary drivers during standby mode may reduce leakage current through the auxiliary drivers.

Figure 2D:
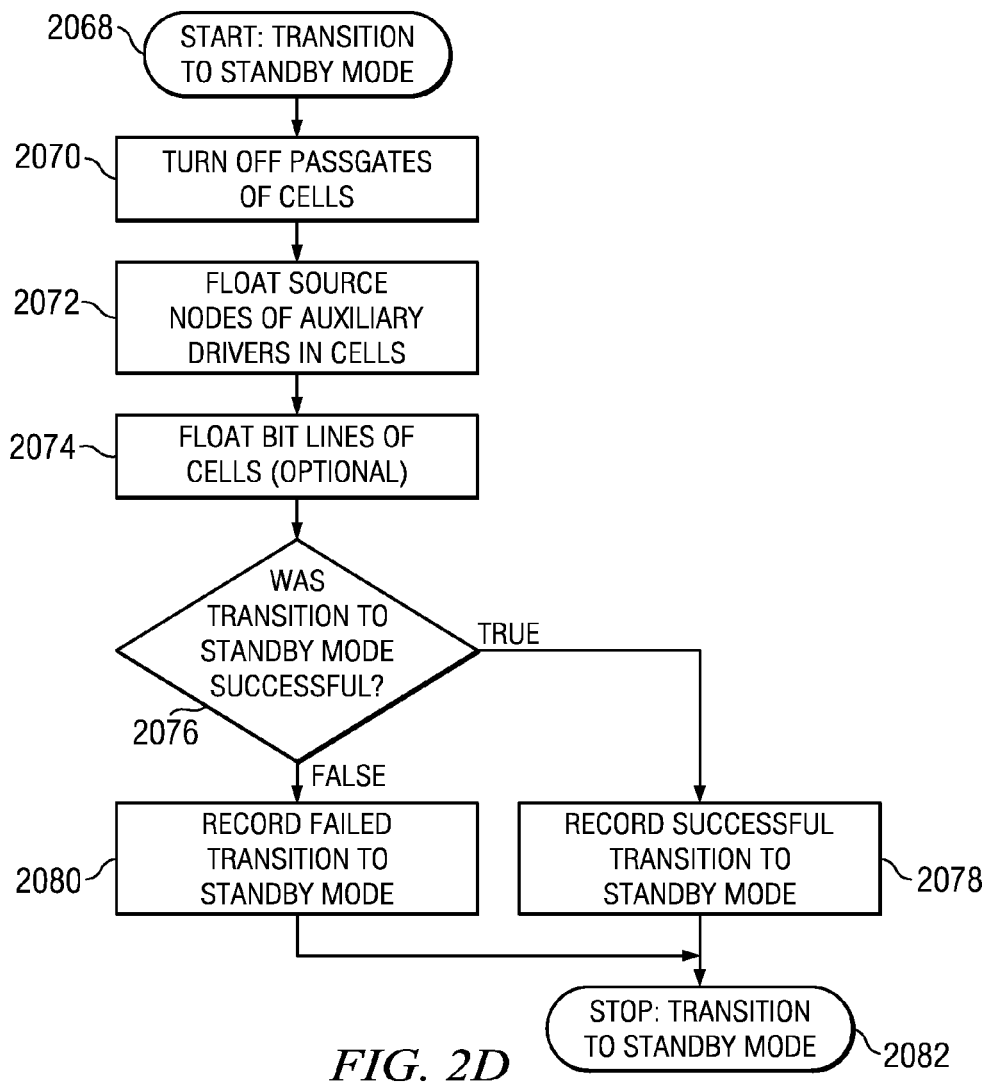

Referring to FIG. 2D, the transition to standby mode begins (2068) with step (2070) which is to turn off the passgates (1022, 1044). Next, step (2072) is to float the source nodes of the auxiliary drivers (1026, 1048) to reduce leakage current through the auxiliary drivers (1026, 1048). Then, step (2074) is to optionally float the bit lines (1024, 1046). During a test mode of the transition to standby mode operation (including measurements of leakage currents in SRAM cell arrays) step (2076) is to determine if the transition to standby mode was successful (for example if leakage currents were below target values). If the transition to standby mode was successful, step (2078) is to record a successful transition to standby mode operation for the SRAM cells (1002, 1004). If the transition to standby mode was not successful, step (2080) is to record a failed transition to standby mode operation for the SRAM cells (1002, 1004). Next, the transition to standby mode operation is ended (2082). In an alternate embodiment, steps (2072) and (2074) may be performed in any order.

Figure 3:
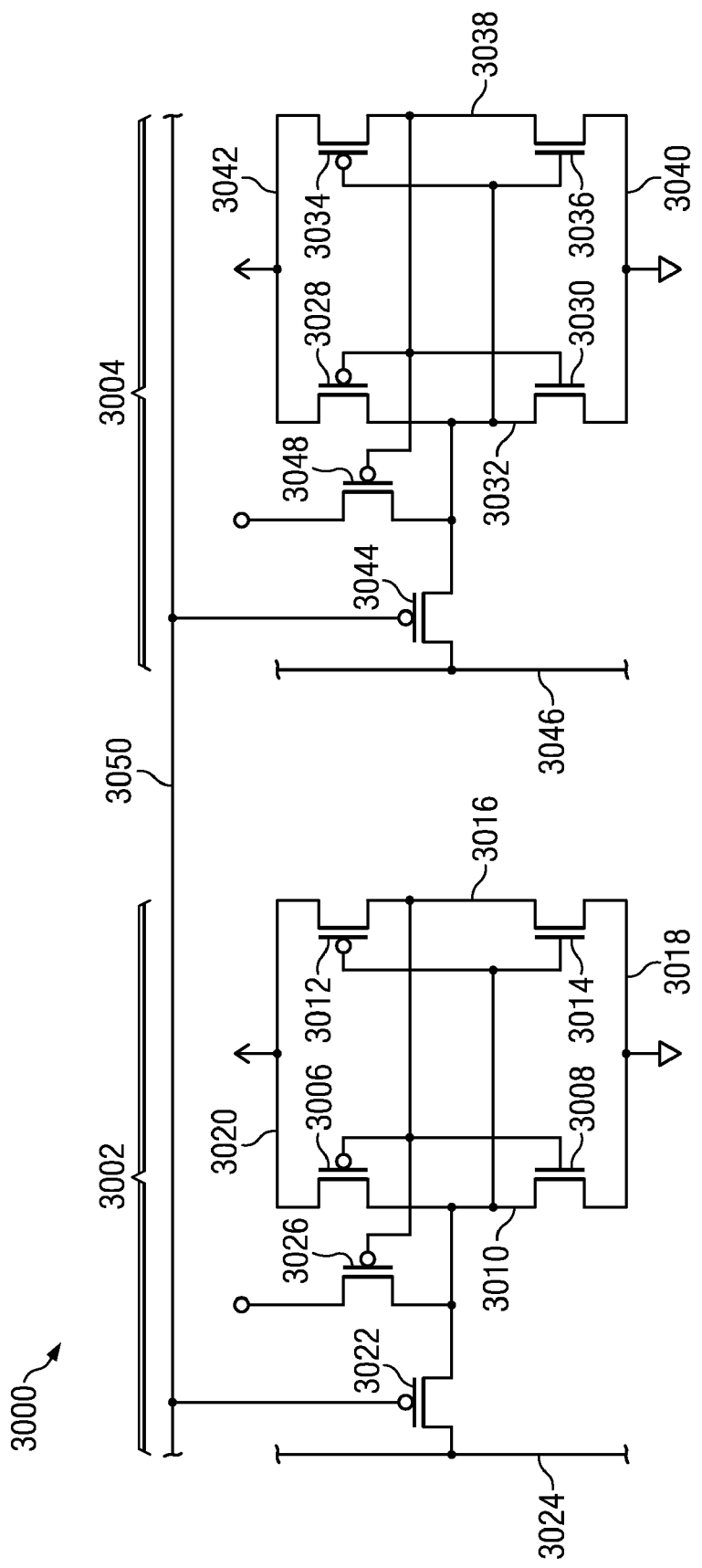
FIG. 3 is a circuit diagram of SRAM cells formed according to a second embodiment.

FIG. 3 is a circuit diagram of SRAM cells formed according to a second embodiment. An integrated circuit includes an SRAM cell array (3000) containing a first SRAM cell (3002) and a second SRAM cell (3004). The first SRAM cell (3002) includes a PMOS first bit driver (3006) and an NMOS first bit load (3008). A drain node of the first bit driver (3006) and a drain node of the first bit load (3008) are connected to a first bit-side data node (3010). The first SRAM cell (3002) also includes a PMOS first bit-bar driver (3012) and an NMOS first bit-bar load (3014). A drain node of the first bit-bar driver (3012) and a drain node of the first bit-bar load (3014) are connected to a first bit-bar-side data node (3016). A source node of the first bit load (3008) and a source node of the first bit-bar load (3014) are connected to a first Vss node (3018). A source node of the first bit driver (3006) and a source node of the first bit-bar driver (3012) are connected to a first Vdd node (3020). A gate node of the first bit driver (3006) and a gate node of the first bit load (3008) are connected to the first bit-bar-side data node (3016). Similarly, a gate node of the first bit-bar driver (3012) and a gate node of the first bit-bar load (3014) are connected to the first bit-side data node (3010). Therefore, the first SRAM cell (3002) contains cross-coupled inverters.

The first SRAM cell (3002) also includes a first passgate (3022). The first passgate (3022) is preferably a PMOS transistor as depicted in FIG. 3, but may possibly be an NMOS transistor or other switching mechanism. A first source/drain node of the first passgate (3022) is connected to the first bit-side data node (3010) and a second source/drain node of the first passgate (3022) is connected to a first bit line (3024). In one embodiment, an on-state current of the first passgate transistor (3022) is between 100 percent and 200 percent of an on-state current of the first bit driver (3006).

The first SRAM cell (3002) also includes a PMOS first auxiliary driver transistor (3026). A drain node of the first auxiliary driver transistor (3026) is connected to the first bit-side data node (3010). A gate node of the first auxiliary driver transistor (3026) is connected to the first bit-bar-side data node (3016). In one embodiment, an on-state current of the first auxiliary driver transistor (3026) is between 75 percent and 200 percent of an on-state current of the first passgate transistor (3022). In an alternate embodiment, the first auxiliary driver transistor (3026) may have a threshold voltage magnitude is more than 50 millivolts lower than a threshold voltage magnitude of the first bit load (3008). In a further embodiment, the on-state current of the first auxiliary driver transistor (3026) may be higher than an on-state current of the first bit load (1008).

Similarly, the second SRAM cell (3004) includes a second bit driver (3028) and a second bit load (3030); a drain node of the second bit driver (3028) and a drain node of the second bit load (3030) are connected to a second bit-side data node (3032). The second SRAM cell (3004) includes a second bit-bar driver (3034) and a second bit-bar load (3036); a drain node of the second bit-bar driver (3034) and a drain node of the second bit-bar load (3036) are connected to a second bit-bar-side data node (3038). A source node of the second bit load (3030) and a source node of the second bit-bar load (3036) are connected to a second Vss node (3040). A source node of the second bit driver (3028) and a source node of the second bit-bar driver (3034) are connected to a second Vdd node (3042). A gate node of the second bit driver (3028) and a gate node of the second bit load (3030) are connected to the second bit-bar-side data node (3038). A gate node of the second bit-bar driver (3034) and a gate node of the second bit-bar load (3036) are connected to the second bit-side data node (3032).

The second SRAM cell (3004) also includes a second passgate (3044). A first source/drain node of the second passgate (3044) is connected to the second bit-side data node (3032) and a second source/drain node of the second passgate (3044) is connected to a second bit line (3046). The second SRAM cell (3004) also includes a second auxiliary driver transistor (3048). A drain node of the second auxiliary driver transistor (3048) is connected to the second bit-side data node (3032). A gate node of the second auxiliary driver transistor (3048) is connected to the second bit-bar-side data node (3038).

A gate node of the first passgate (3022) and a gate node of the second passgate (3044) are connected to a word line (3050). It is common for the first bit line (3024) to be connected to passgates in other SRAM cells (not shown) in a same column as the first SRAM cell (3002). Similarly, it is common for the second bit line (3046) to be connected to passgates in other SRAM cells (not shown) in a same column as the second SRAM cell (3004). Furthermore, it is common for the word line (3050) to be connected to passgates in other SRAM cells (not shown) in a same row as the first SRAM cell (3002) and the second SRAM cell (3004).

In one embodiment, the driver transistors (3006, 3012, 3028, 3034) and the load transistors (3008, 3014, 3030, 3036) are a minimum width consistent with fabrication methods used to manufacture the SRAM array (3000). Minimizing driver and load transistor widths advantageously reduces a size of the SRAM array (3000) and reduces manufacturing costs per SRAM array.

In another embodiment, a threshold voltage magnitude of the first bit-bar driver (3012) may be between a product of Vdd minus Vss times a ratio of an on-state current of the first passgate (3022) to an on-state current of the first bit driver (3006) and a product of Vdd minus Vss times a ratio of the on-state current of the first passgate (3022) to a sum of the on-state current of the first bit driver (3006) and an on-state current of the first auxiliary driver transistor (3026), possibly reducing leakage current in the first bit-bar driver (3012).

In an alternate embodiment, the driver transistors (3006, 3012, 3028, 3034), the load transistors (3008, 3014, 3030, 3036) and the auxiliary driver transistors (3026, 3048) may be finFET transistors. Forming the SRAM array (3000) with finFET transistors may advantageously reduce a size of the SRAM array (3000) and reduce manufacturing costs per SRAM array.

During an operation to write a data bit to the first SRAM cell (3002), the first SRAM cell (3002) is addressed for writing, and the second SRAM cell (3004) is half-addressed. The second bit line (3046) is pre-charged to a voltage level appropriate for maintaining data stability in half addressed SRAM cells, and then optionally floated. In one embodiment of a single sided write operation, the second bit line (3046) may be pre-charged to a voltage level lower than Vdd minus Vtp. In an alternate embodiment, the second bit line (3046) may be pre-charged to a voltage level lower than Vss plus Vtp.

A source node of the second auxiliary driver transistor (3048) is connected to voltage level appropriate for maintaining data stability in half addressed SRAM cells. In one embodiment, the source node of the second auxiliary driver transistor (4048) may be biased to a voltage level higher than Vss plus Vtp. In an alternate embodiment, the source node of the second auxiliary driver transistor (3048) may be biased to a voltage level higher than Vdd minus Vtp. In a further embodiment, the source node of the second auxiliary driver transistor (3048) may be biased to a voltage level higher than Vdd.

The first bit line (3024) is connected to a voltage source appropriate for providing adequate write margin in an addressed SRAM cell. In one embodiment of a single sided write low operation, the first bit line (3024) may be biased to a voltage level below Vdd minus Vtp. In an alternate embodiment of a single sided write low operation, the first bit line (3024) may be biased to a voltage level below Vss plus Vtp. In one embodiment of a single sided write high operation, the first bit line (3024) may be biased to a voltage level above Vss plus Vtp. In an alternate embodiment of a single sided write high operation, the first bit line (3024) may be biased to a voltage level above Vdd minus Vtp.

A source node of the first auxiliary driver transistor (3026) may be floated, or may be connected to a voltage level appropriate for providing adequate write margin in an addressed SRAM cell. In one embodiment of a single sided write low operation, the source node of the first auxiliary driver transistor (3026) may be biased to a voltage level below Vdd minus Vtp. In an alternate embodiment of a single sided write low operation, the source node of the first auxiliary driver transistor (3026) may be biased to a voltage level below Vss plus Vtp. In a further embodiment of a single sided write low operation, the source node of the first auxiliary driver transistor (3026) may be biased to a voltage level below Vss.

In one embodiment of a single sided write high operation, the source node of the first auxiliary driver transistor (3026) may be biased to a voltage level above Vss plus Vtp. In an alternate embodiment of a single sided write high operation, the source node of the first auxiliary driver transistor (3026) may be biased to a voltage level above Vdd minus Vtp. In a further embodiment of a single sided write high operation, the source node of the first auxiliary driver transistor (3026) may be biased to a voltage level above Vdd.

The word line (3050) is connected to a voltage source whereby the first passgate (3022) and the second passgate (3044) are turned on. In a successful write operation, a voltage level on the first bit line (3024) is transferred to the first bit-side data node (3010) and a desired voltage level on the first bit-side data node (3010) becomes stabilized.

Floating source nodes of auxiliary driver transistors in addressed SRAM cells during a single sided write operation may reduce write failures. Biasing the source nodes as recited herein may also reduce write failures. Moreover, biasing source nodes of auxiliary driver transistors in half-addressed SRAM cells during a single sided write operation as recited herein may reduce data upsets in the half addressed SRAM cells.

Figure 4A:
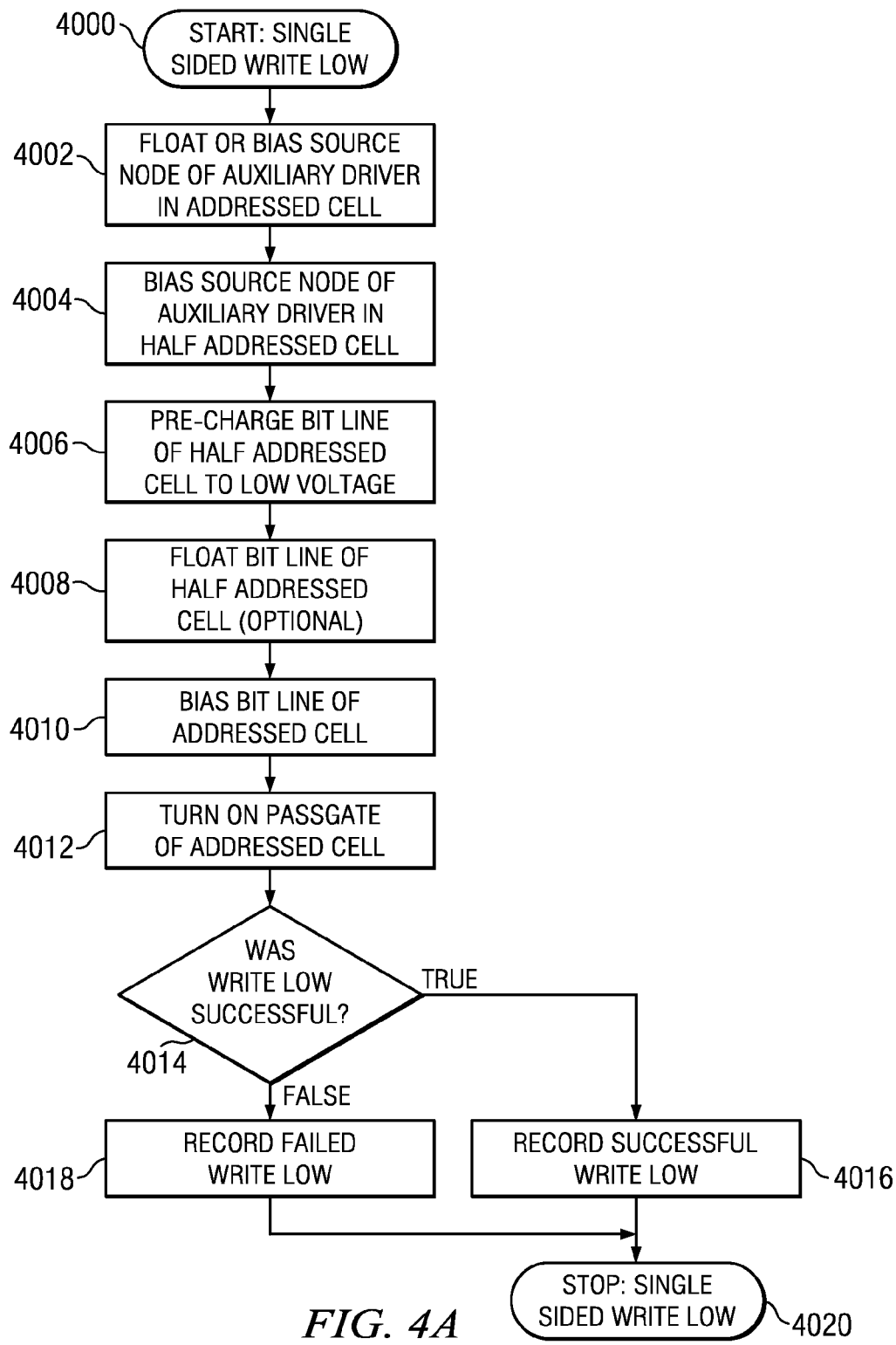
FIG. 4A through FIG. 4D are flowcharts of a first data bit value write operation, a second data bit value write operation, a read operation, and a transition to standby mode, respectively, for the second embodiment.

FIG. 4A through FIG. 4D are flowcharts of a single sided write low operation, a single sided write high operation, a read operation, and a transition to standby mode, respectively. The flowcharts in FIG. 4A through FIG. 4D refer to the SRAM array depicted in FIG. 3. Referring to FIG. 4A, the single sided write low operation begins (4000) with step (4002) which is to float or bias the source node of the auxiliary driver (3026) in the addressed SRAM cell (3002) to improve a write low margin in the addressed SRAM cell (3002). Next, step (4004) is to bias the source node of the auxiliary driver (3048) in the half addressed SRAM cell (3004) to improve a static noise margin value in the half addressed SRAM cell (3004). Subsequently, step (4006) is to pre-charge the bit line (3046) of the half addressed SRAM cell (3004) to a low voltage. Then, step (4008) is to optionally float the bit line (3046) of the half addressed SRAM cell (3004). Next, step (4010) is to bias the bit line (3024) of the addressed SRAM cell (3002) to a low voltage. Then, step (4012) is to turn on the passgate (3022) of the addressed SRAM cell (3002). During a test mode of the single sided write low operation, step (4014) is to determine if a low voltage was successfully transferred to a bit-side data node and if a data upset occurred in the half-addressed SRAM cell (3004). If the low voltage was successfully transferred and no data upset occurred, step (4016) is to record a successful single sided write low operation for the addressed SRAM cell (3002). If the low voltage was not successfully transferred or a data upset occurred, step (4018) is to record a failed single sided write low operation for the addressed SRAM cell (3002). Next, the single sided write low operation is ended (4020). In an alternate embodiment, steps (4002), (4004), (4006) and (4010) may be performed in any order.

Figure 4B:
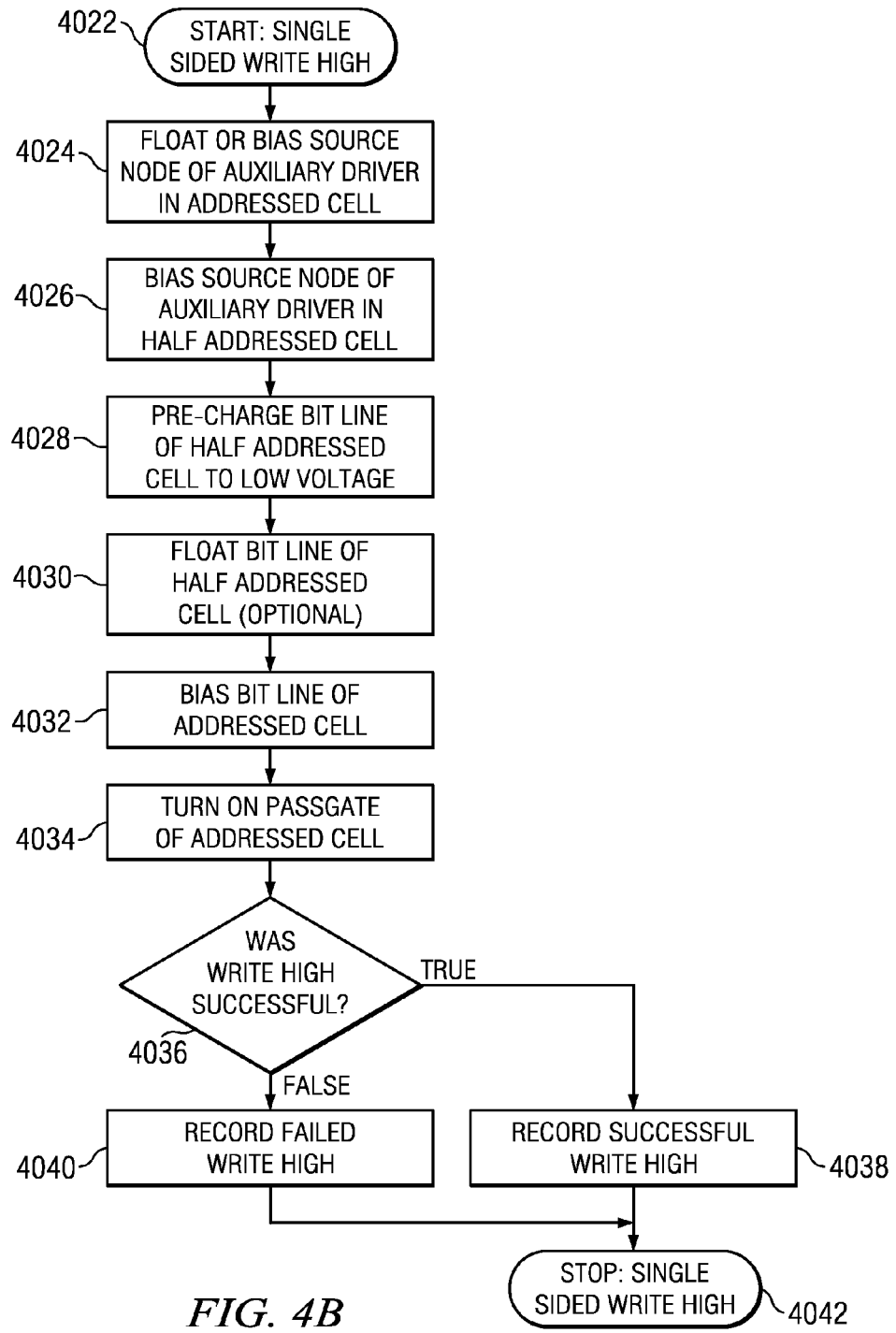

Referring to FIG. 4B, the single sided write high operation begins (4022) with step (4024) which is to float or bias the source node of the auxiliary driver (3026) in the addressed SRAM cell (3002) to improve a write high margin in the addressed SRAM cell (3002). Next, step (4026) is to bias the source node of the auxiliary driver (3048) in the half addressed SRAM cell (3004) to improve the static noise margin value in the half-addressed SRAM cell (3004). Then, step (4028) is to pre-charge the bit line (3046) of the half addressed SRAM cell (3004) to a low voltage. Subsequently, step (4030) is to optionally float the bit line (3046) of the half addressed SRAM cell (3004). Next, step (4032) is to bias the bit line (3024) of the addressed SRAM cell (3002) to a high voltage. Then, step (4034) is to turn on the passgate (3022) of the addressed SRAM cell (3002). During a test mode of the single sided write low operation, step (4036) is to determine if a high voltage was successfully transferred to a bit-side data node and if a data upset occurred in the half-addressed SRAM cell (3004). If the high voltage was successfully transferred and no data upset occurred, step (4038) is to record a successful single sided write high operation for the addressed SRAM cell (3002). If the high voltage was not successfully transferred or a data upset occurred, step (4040) is to record a failed single sided write high operation for the addressed SRAM cell (3002). Next, the single sided write high operation is ended (4042). In an alternate embodiment, steps (4024), (4026), (4028) and (4032) may be performed in any order.

Referring back to FIG. 3, during an operation to read a data bit value from the first SRAM cell (3002), the first SRAM cell (3002) is addressed for reading, and the second SRAM cell (3004) is half-addressed. The source node of the second auxiliary driver transistor (3048) is connected to a voltage level appropriate for maintaining data stability in half addressed SRAM cells, as recited with respect to the single sided write operation above in reference to FIG. 3.

The source node of the first auxiliary driver transistor (3026) is connected to a voltage level appropriate for providing adequate static noise margin in an addressed SRAM cell. In one embodiment of a read operation, the source node of the first auxiliary driver transistor (3026) may be biased to a voltage level above Vss plus Vtp. In an alternate embodiment, the source node of the first auxiliary driver transistor (3026) may be biased to a voltage level above Vdd minus Vtp. In a further embodiment, the source node of the first auxiliary driver transistor (3026) may be biased to a voltage level above Vdd.

The first bit line (3024) is connected to a voltage level appropriate for a read operation, and is then optionally floated. In one embodiment of a read operation, the first bit line (3024) may be biased to a voltage level below Vdd minus Vtp. In an alternate embodiment, the first bit line (3024) may be biased to a voltage level below Vss plus Vtp.

The second bit line (3046) is typically also pre-charged to a voltage level appropriate for maintaining data stability in half addressed SRAM cells, and then optionally floated. In one embodiment of a read operation, the second bit line (3046) may be pre-charged to a voltage level lower than Vdd minus Vtp. In an alternate embodiment, the second bit line (3046) may be pre-charged to a voltage level lower than Vss plus Vtp.

The word line (3050) is connected to a voltage source, for example through a word line switch (not shown) whereby the first passgate (3022) and the second passgate (3044) are turned on. In a successful read operation, a voltage level on the first bit-side data node (3010) is transferred to the first bit line (3024). As a result, the data bit is available to other circuits (not shown) connected to the first bit line (3024) but located outside the SRAM array (3000) (such as a sense amplifier). A successful read operation also requires data values in half-addressed SRAM cells to be free of data upsets.

Biasing source nodes of auxiliary driver transistors in addressed SRAM cells as recited above during a read operation may reduce read failures. Furthermore, biasing source nodes of auxiliary driver transistors in half-addressed SRAM cells as recited above during a read operation may reduce data upsets in the half addressed SRAM cells.

Figure 4C:
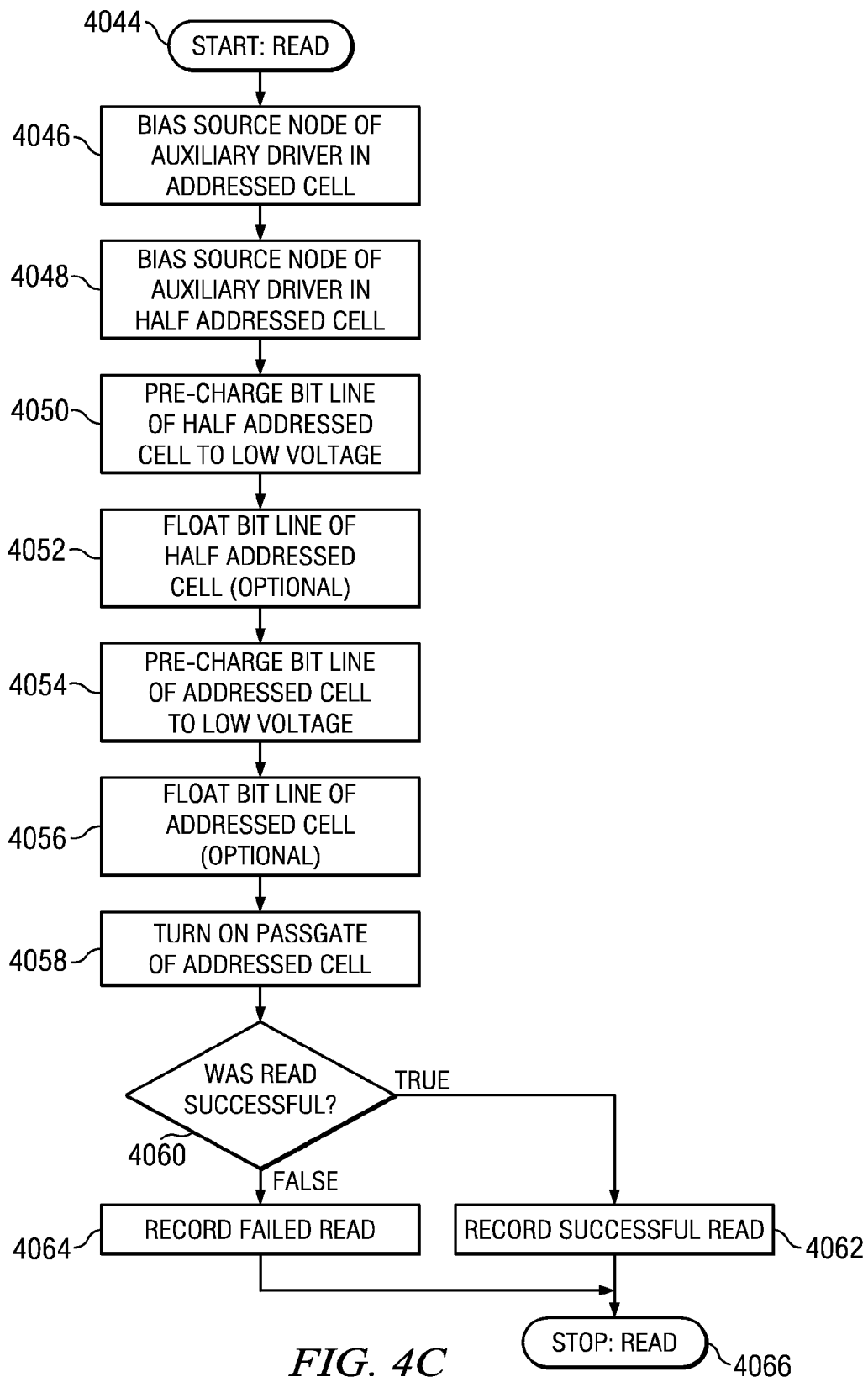

Referring to FIG. 4C, the read operation begins (4044) with step (4046) which is to bias the source node of the auxiliary driver (3026) in the addressed SRAM cell (3002) to improve a static noise margin value in the addressed SRAM cell (3002). Next, step (4048) is to bias the source node of the auxiliary driver (3048) in the half addressed SRAM cell (3004) to improve the static noise margin value in the half addressed SRAM cell (3004). Subsequently, step (4050) is to pre-charge the bit line (3046) of the half addressed SRAM cell (3004) to a low voltage. Then, step (4052) is to optionally float the bit line (3046) of the half addressed SRAM cell (3004). Subsequently, step (4054) is to pre-charge the bit line (3024) of the addressed SRAM cell (3002) to a low voltage. Next, step (4056) is to optionally float the bit line (3024) of the addressed SRAM cell (3002). Then, step (4058) is to turn on the passgate (3022) of the addressed SRAM cell (3002). During a test mode of the read operation, step (4060) is to determine if a voltage level on the bit-side data node (3010) was successfully transferred to the bit line (3024) and if a data upset occurred in the half-addressed SRAM cell (3004). If the voltage level was successfully transferred and if no data upset occurred in the half-addressed SRAM cell (3004), step (4062) is to record a successful read operation for the addressed SRAM cell (3002). If the voltage level was not successfully transferred or if a data upset occurred, step (4064) is to record a failed read operation for the addressed SRAM cell (3002). Next, the read operation is ended (4066). In an alternate embodiment, steps (4046), (4048), (4050) and (4054) may be performed in any order.

Referring back to FIG. 3, in a standby mode the source node of the first auxiliary driver transistor (3026) and the source node of the second auxiliary driver transistor (3048) are floated. The first bit line (3024) and the second bit line (3046) are floated. The word line (3050) is connected to a voltage source whereby the first passgate (3022) and the second passgate (3044) are turned off. Floating source nodes of auxiliary drivers during standby mode advantageously reduces leakage current through the auxiliary drivers.

Figure 4D:
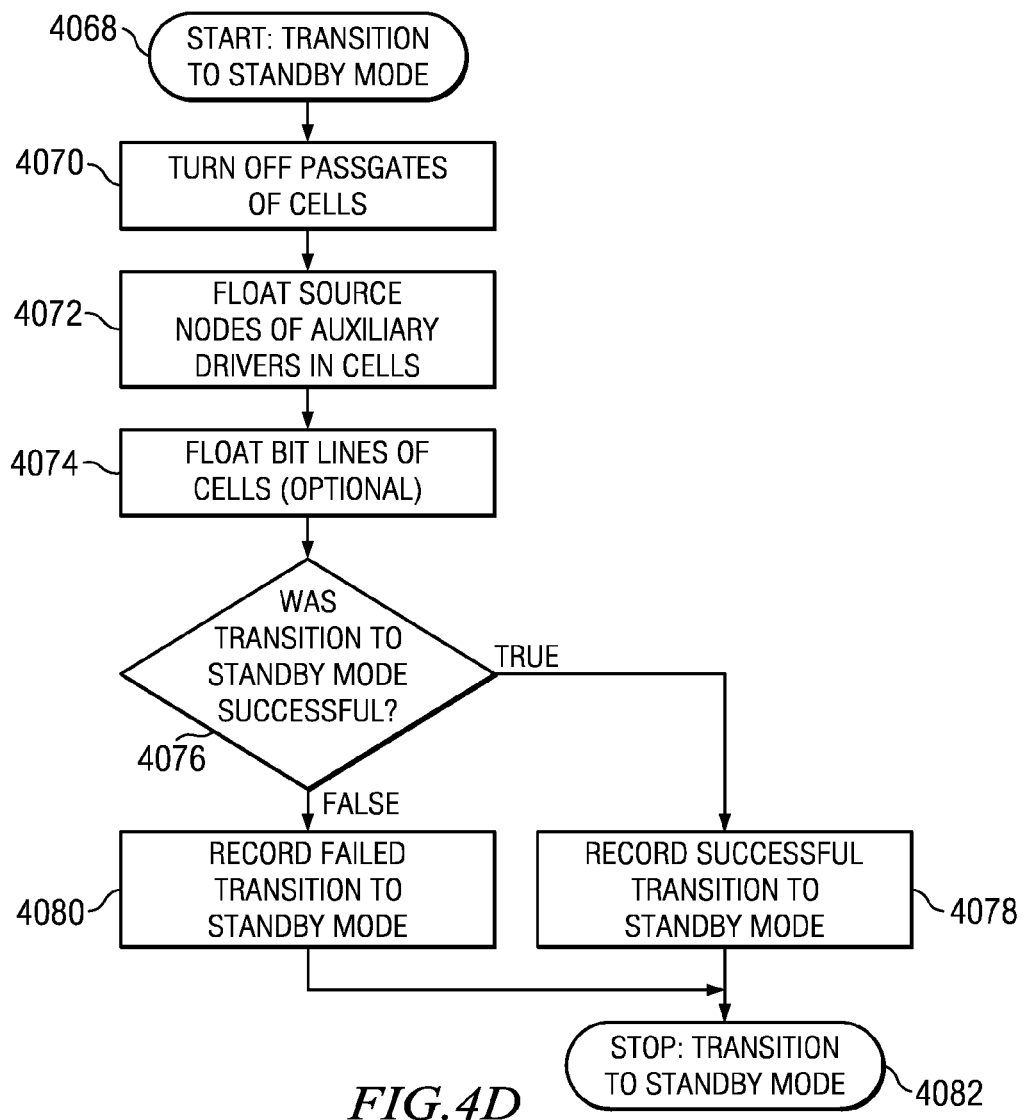

Referring to FIG. 4D, the transition to standby mode begins (4068) with step (4070) which is to turn off the passgates (3022, 3044) of the SRAM cells (3002, 3004). Next, step (4072) is to float the source nodes of the auxiliary drivers (3026, 3048) of the SRAM cells (3002, 3004) to reduce leakage current through the auxiliary drivers (3026, 3048). Then, step (4074) is to optionally float the bit lines (3024, 3046) of the SRAM cells (3002, 3004). During a test mode of the transition to standby mode operation (such as modes including measurements of leakage currents in SRAM cell arrays), step (4076) is to determine if the transition to standby mode was successful (for example, if leakage currents were below target values). If the transition to standby mode was successful, step (4078) is to record a successful transition to standby mode operation for the SRAM cells (3002, 3004). If the transition to standby mode was not successful, step (4080) is to record a failed transition to standby mode operation for the SRAM cells (3002, 3004). Next, the transition to standby mode operation is ended (4082). In an alternate embodiment, steps (4072) and (4074) may be performed in any order.

Figure 5:
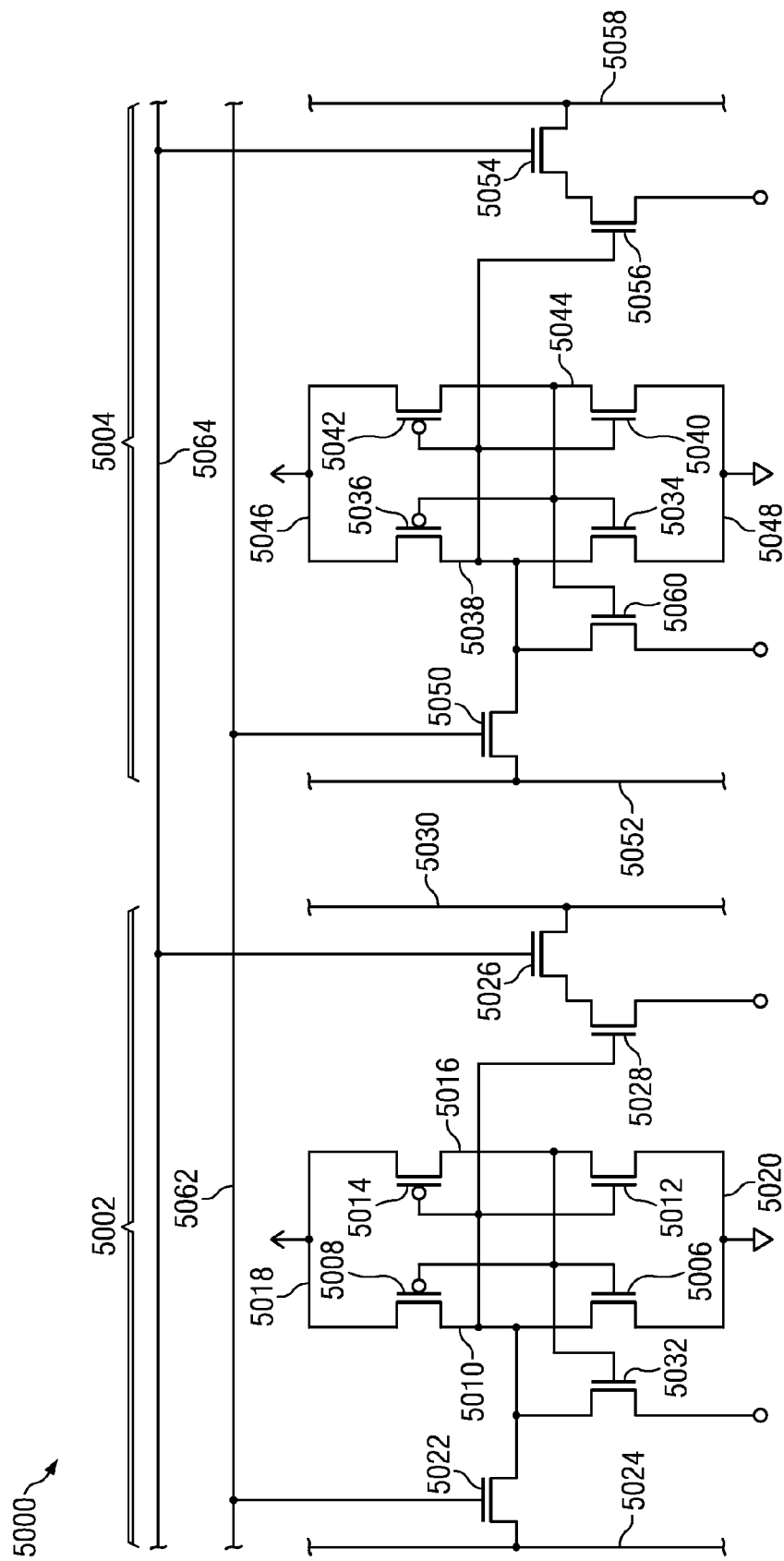
FIG. 5 is a circuit diagram of SRAM cells formed according to a third embodiment.

FIG. 5 is a circuit diagram of SRAM cells formed according to a third embodiment. An integrated circuit contains an SRAM cell array (5000) further containing a first SRAM cell (5002) and a second SRAM cell (5004). The first SRAM cell (5002) includes an NMOS first bit driver (5006) and a PMOS first bit load (5008). A drain node of the first bit driver (5006) and a drain node of the first bit load (5008) are connected to a first bit-side data node (5010). The first SRAM cell (5002) also includes an NMOS first bit-bar driver (5012) and a PMOS first bit-bar load (5014). A drain node of the first bit-bar driver (5012) and a drain node of the first bit-bar load (5014) are connected to a first bit-bar-side data node (5016). A source node of the first bit load (5008) and a source node of the first bit-bar load (5014) are connected to a first Vdd node (5018). A source node of the first bit driver (5006) and a source node of the first bit-bar driver (5012) are connected to a first Vss node (5020). A gate node of the first bit driver (5006) and a gate node of the first bit load (5008) are connected to the first bit-bar-side data node (5016). Similarly, a gate node of the first bit-bar driver (5012) and a gate node of the first bit-bar load (5014) are connected to the first bit-side data node (5010).

The first SRAM cell (5002) also includes a first bit-side passgate (5022). The first bit-side passgate (5022) is preferably an NMOS transistor as depicted in FIG. 5A, but may possibly be a PMOS transistor or other switching mechanism. A first source/drain node of the first bit-side passgate (5022) is connected to the first bit-side data node (5010) and a second source/drain node of the first bit-side passgate (5022) is connected to a first bit line (5024). In one embodiment, an on-state current of the first passgate transistor (5022) is between 100 percent and 200 percent of an on-state current of the first bit driver (5006).

The first SRAM cell (5002) includes a first read buffer which includes a first bit-bar-side access transistor (5026) and an NMOS first buffer driver (5028). The first bit-bar-side access transistor (5026) may be an NMOS transistor as depicted in FIG. 5A, but may possibly be a PMOS transistor or other switching mechanism. A first source/drain node of the first bit-bar-side access transistor (5026) is connected to a drain node of the first buffer driver (5028) and a second source/drain node of the first bit-bar-side access transistor (5026) is connected to a first bit-bar line (5030). A gate node of the first buffer driver (5028) is connected to the first bit-side data node (5010).

The first SRAM cell (5002) also includes an NMOS first auxiliary driver transistor (5032). A drain node of the first auxiliary driver transistor (5032) is connected to the first bit-side data node (5010). A gate node of the first auxiliary driver transistor (5032) is connected to the first bit-bar-side data node (5016). In one embodiment, an on-state current of the first auxiliary driver transistor (5032) is between 75 percent and 200 percent of an on-state current of the first passgate transistor (5022). In an alternate embodiment, the first auxiliary driver transistor (5032) may have a threshold voltage which is more than 50 millivolts lower than a threshold voltage of the first bit driver (5006). In a further embodiment, the on-state current of the first auxiliary driver transistor (5032) may be higher than an on-state current of the first bit driver (5006).

The second SRAM cell (5004) includes a second bit driver (5034) and a second bit load (5036); a drain node of the second bit driver (5034) and a drain node of the second bit load (5036) are connected to a second bit-side data node (5038). The second SRAM cell (5004) includes a second bit-bar driver (5040) and a second bit-bar load (5042); a drain node of the second bit-bar driver (5040) and a drain node of the second bit-bar load (5042) are connected to a second bit-bar-side data node (5044). A source node of the second bit load (5036) and a source node of the second bit-bar load (5042) are connected to a second Vdd node (5046). A source node of the second bit driver (5034) and a source node of the second bit-bar driver (5040) are connected to a second Vss node (5048). A gate node of the second bit driver (5034) and a gate node of the second bit load (5036) are connected to the second bit-bar-side data node (5044). A gate node of the second bit-bar driver (5040) and a gate node of the second bit-bar load (5042) are connected to the second bit-side data node (5038).

The second SRAM cell (5004) also includes a second bit-side passgate (5050). A first source/drain node of the second bit-side passgate (5050) is connected to the second bit-side data node (5038) and a second source/drain node of the second bit-side passgate (5050) is connected to a second bit line (5052).

The second SRAM cell (5004) includes a second read buffer which includes a second bit-bar-side access transistor (5054) and a second buffer driver (5056). A source node of the second bit-bar-side access transistor (5054) is connected to a drain node of the second buffer driver (5056) and a drain node of the second bit-bar-side access transistor (5054) is connected to a second bit-bar line (5058). A gate node of the second buffer driver (5056) is connected to the second bit-side data node (5038). In alternate embodiments, read buffers may be formed with PMOS buffer driver transistors.

The second SRAM cell (5004) also includes a second auxiliary driver transistor (5060). A drain node of the second auxiliary driver transistor (5060) is connected to the second bit-side data node (5038). A gate node of the second auxiliary driver transistor (5060) is connected to the second bit-bar-side data node (5044).

A gate node of the first bit-side passgate (5022) and a gate node of the second bit-side passgate (5050) are connected to a first word line (5062). A gate node of the first bit-bar-side access transistor (5026) and a gate node of the second bit-bar-side access transistor (5054) are connected to a read-only word line (5064). In some embodiments, the read-only word line (5064) may be identical with the first word line (5062). It is common for the first bit line (5024) to be connected to bit-side passgates in other SRAM cells (not shown) in a same column as the first SRAM cell (5002). It is common for the first bit-bar line (5030) to be connected to bit-bar-side access transistors in other SRAM cells (not shown) in a same column as the first SRAM cell (5002). Similarly, it is common for the second bit line (5052) to be connected to bit-side passgates in other SRAM cells (not shown) in a same column as the second SRAM cell (5004), and it is common for the second bit-bar line (5058) to be connected to bit-bar-side access transistors in other SRAM cells (not shown) in a same column as the second SRAM cell (5004). Furthermore, it is common for the first word line (5062) and the read-only word line (5064) to be connected to passgates in other SRAM cells (not shown) in a same row as the first SRAM cell (5002) and the second SRAM cell (5004).

In one embodiment, the driver transistors (5006, 5012, 5034, 5040) and the load transistors (5008, 5014, 5036, 5042) are a minimum width consistent with fabrication methods used to manufacture the SRAM array (5000). Minimizing driver and load transistor widths advantageously reduces a size of the SRAM array (5000) and reduces manufacturing costs per SRAM array.

In another embodiment, a threshold voltage of the first bit-bar driver (5012) may be between a product of Vdd minus Vss times a ratio of an on-state current of the first passgate (5022) to an on-state current of the first bit driver (5006) and a product of Vdd minus Vss times a ratio of the on-state current of the first passgate (5022) to a sum of the on-state current of the first bit driver (5006) and an on-state current of the first auxiliary driver transistor (5032), advantageously reducing leakage current in the first bit-bar driver (5012).

In an alternate embodiment, the driver transistors (5006, 5012, 5034, 5040), the load transistors (5008, 5014, 5036, 5042) and the auxiliary driver transistors (5032, 5060) may be finFET transistors. Forming the SRAM array (5000) with finFET transistors may advantageously reduce a size of the SRAM array (5000) and reduce manufacturing costs per SRAM array.

During an operation to write a data bit to the first SRAM cell (5002), the first SRAM cell (5002) is addressed for writing, and the second SRAM cell (5004) is half-addressed. A source node of the second auxiliary driver transistor (5060) is connected to a voltage level appropriate for maintaining data stability in half addressed SRAM cells. In one embodiment, the source node of the second auxiliary driver transistor (5060) may be biased to a voltage level less than Vdd minus Vtn. In an alternate embodiment, the source node of the second auxiliary driver transistor (5060) may be biased to a voltage level less than Vss plus Vtn. In a further embodiment, the source node of the second auxiliary driver transistor (5060) may be biased to a voltage level less than Vss.

The second bit line (5052) is pre-charged to a voltage level appropriate for maintaining data stability in half addressed SRAM cells, and then optionally floated. In one embodiment of a single sided write operation, the second bit line (5052) may be pre-charged to a voltage level higher than Vss plus Vtn. In an alternate embodiment, the second bit line (5052) may be pre-charged to a voltage level higher than Vdd minus Vtn.

The second bit-bar line (5058) may be pre-charged to a high voltage, for example above Vss plus Vtn, and then optionally floated. A source node of the second buffer driver (5056) may be biased or floated. The first bit-bar line (5030) may be pre-charged to a high voltage, for example above Vss plus Vtn, and then optionally floated. A source node of the first buffer driver (5028) may be biased or floated.

A source node of the first auxiliary driver transistor (5032) may be floated or may be connected to a voltage level appropriate for providing adequate write margin in an addressed SRAM cell. In one embodiment of a single sided write low operation, the source node of the first auxiliary driver transistor (5032) may be biased to a voltage level below Vdd minus Vtn. In an alternate embodiment of a single sided write low operation, the source node of the first auxiliary driver transistor (5032) may be biased to a voltage level below Vss plus Vtn. In a further embodiment of a single sided write low operation, the source node of the first auxiliary driver transistor (5032) may be biased to a voltage level below Vss.

In one embodiment of a single sided write high operation, the source node of the first auxiliary driver transistor (5032) may be biased to a voltage level above Vss plus Vtn. In an alternate embodiment of a single sided write high operation, the source node of the first auxiliary driver transistor (5032) may be biased to a voltage level above Vdd minus Vtn. In a further embodiment of a single sided write high operation, the source node of the first auxiliary driver transistor (5032) may be biased to a voltage level above Vdd.

The first bit line (5024) is biased to a voltage level appropriate for providing adequate write margin in an addressed SRAM cell, which depends on a voltage (that is a low voltage or a high voltage) of the data bit being written. In one embodiment of a single sided write low operation, the first bit line (5024) may be biased to a voltage level below Vdd minus Vtn. In an alternate embodiment of a single sided write low operation, the first bit line (5024) may be biased to a voltage level below Vss plus Vtn. In one embodiment of a single sided write high operation, the first bit line (5024) may be biased to a voltage level above Vss plus Vtn. In an alternate embodiment of a single sided write high operation, the first bit line (5024) may be biased to a voltage level above Vdd minus Vtn.

The word line (5062) is connected to a voltage source (not shown) whereby the first bit-side passgate (5022) and the second bit-side passgate (5050) are turned on. In a successful write operation, a voltage level on the first bit line (5024) is transferred to the first bit-side data node (5010) and a desired voltage level on the first bit-side data node (5010) becomes stabilized.

Floating or biasing source nodes of auxiliary driver transistors in addressed SRAM cells during a single sided write operation as recited herein may reduce write failures. Furthermore, biasing source nodes of auxiliary driver transistors in half-addressed SRAM cells as recited herein during a single sided write operation may reduce data upsets in the half addressed SRAM cells.

Figure 6A:
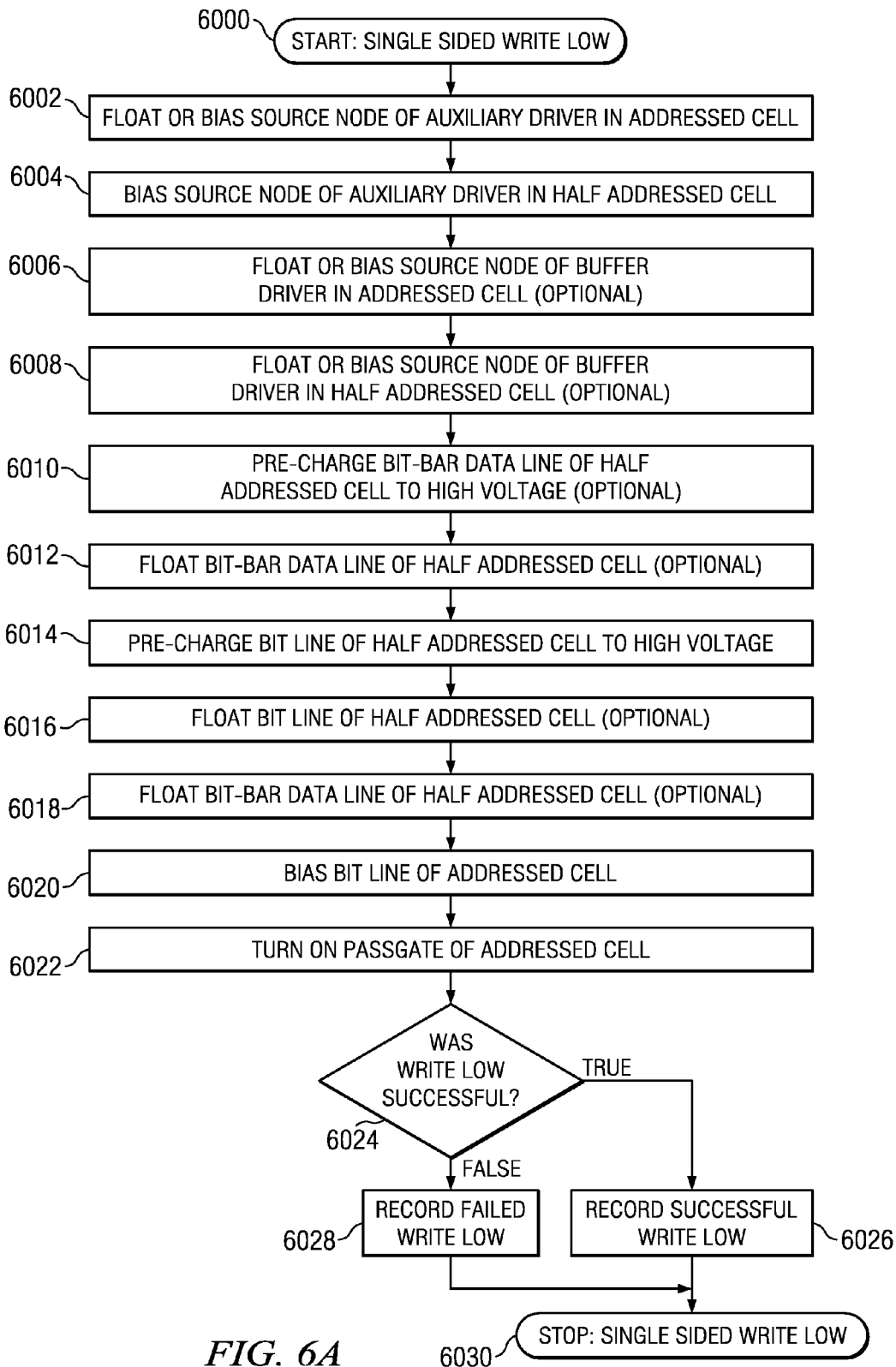
FIG. 6A through FIG. 6D are flowcharts of a first data bit value write operation, a second data bit value write operation, a read operation, and a transition to standby mode, respectively, for the third embodiment.

FIG. 6A through FIG. 6D are flowcharts of a single sided write low operation, a single sided write high operation, a read operation, and a transition to standby mode, respectively. The flowcharts in FIG. 6A through FIG. 6D refer to the SRAM array depicted in FIG. 5. Referring to FIG. 6A, the single sided write low operation begins (6000) with step (6002) which is to float or bias the source node of the auxiliary driver (5032) in the addressed SRAM cell (5002) to improve a write low margin in the addressed SRAM cell (5002). Next, step (6004) is to bias the source node of the auxiliary driver (5060) in the half addressed SRAM cell (5004) to improve a static noise margin value in the half addressed SRAM cell (5004). Then, step (6006) is to optionally bias or float the source node of the buffer driver (5028) in the addressed SRAM cell (5002). Subsequently, step (6008) is to optionally bias or float the source node of the buffer driver (5056) in the half addressed SRAM cell (5004). Next, step (6010) is to optionally pre-charge the bit-bar line (5058) in the half addressed SRAM cell (5004) to a high voltage. Subsequently, step (6012) is to optionally float the bit-bar line (5058) in the half addressed SRAM cell (5004). Then, step (6014) is to pre-charge the bit line (5052) in the half addressed SRAM cell (5004) to a high voltage. Next, step (6016) is to optionally float the bit line (5052) in the half addressed SRAM cell (5004). Subsequently, step (6018) is to optionally float the bit-bar line (5030) of the addressed SRAM cell (5002). Next, step (6020) is to bias the bit line (5024) of the addressed SRAM cell (5002). Then, step (6022) is to turn on the bit-side passgate (5022) of the addressed SRAM cell (5002). During a test mode of the single sided write low operation, step (6024) is to determine if a low voltage was successfully transferred to the bit-side data node (5010) and if a data upset occurred in the half-addressed SRAM cell (5004). If the low voltage was successfully transferred and if no data upset occurred, step (6026) is to record a successful single sided write low operation for the addressed SRAM cell (5002). If the low voltage was not successfully transferred or if a data upset occurred, step (6028) is to record a failed single sided write low operation for the addressed SRAM cell (5002). Next, the single sided write low operation is ended (6030). In an alternate embodiment, steps (6002), (6004), (6006), (6008), (6010), (6014) and (6018) may be performed in any order.

Figure 6B:
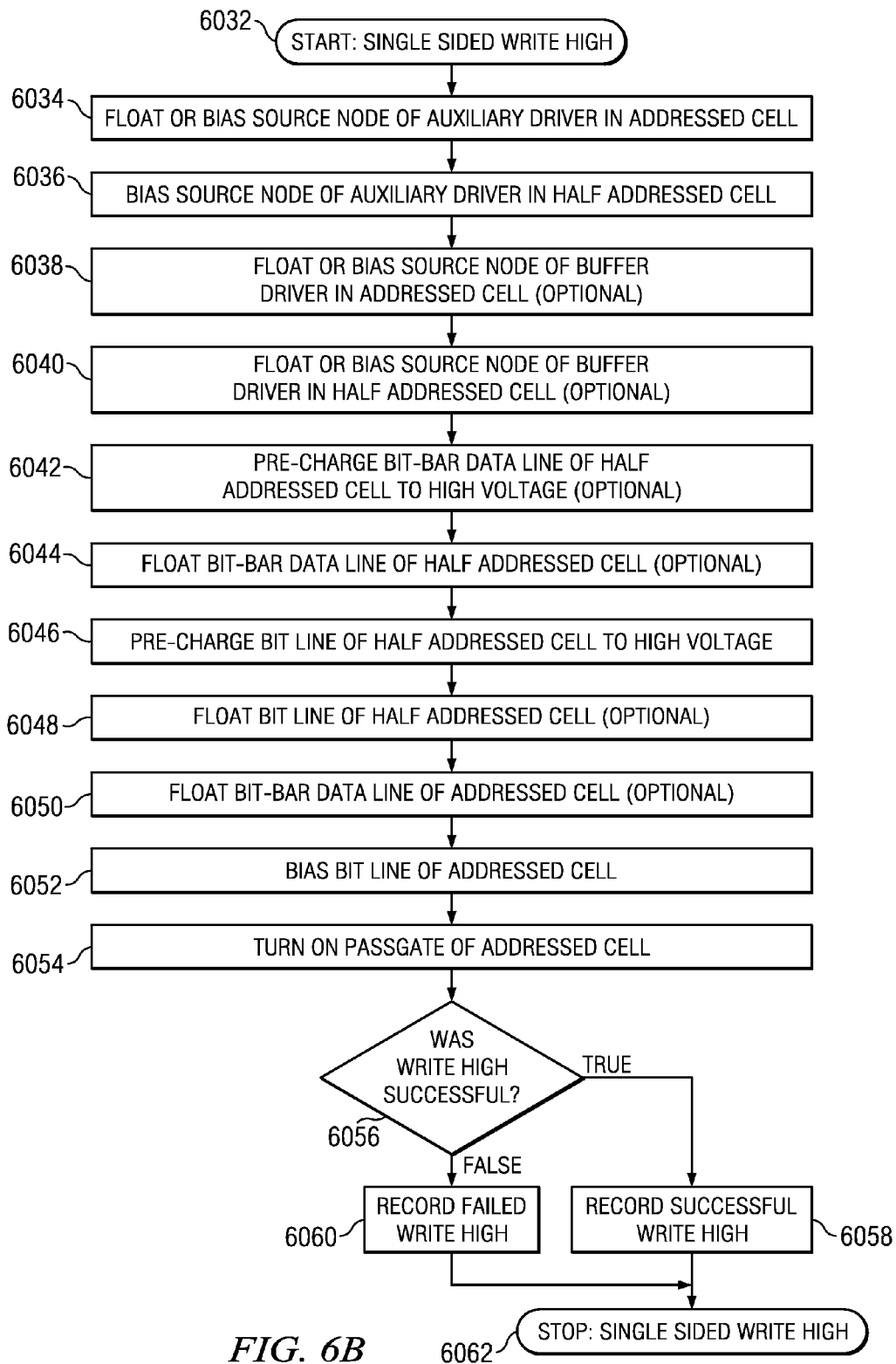

Referring to FIG. 6B, the single sided write high operation begins (6032) with step (6034) which is to float or bias the source node of the auxiliary driver (5032) in the addressed SRAM cell (5002) to improve a write high margin in the addressed SRAM cell (5002). Next, step (6036) is to bias the source node of the auxiliary driver (5060) in the half addressed SRAM cell (5004) to improve the static noise margin value in the half-addressed SRAM cell (5004). Then, step (6038) is to optionally float or bias the source node of the buffer driver (5028) in the addressed SRAM cell (5002). Subsequently, step (6040) is to optionally float or bias the source node of the buffer driver (5056) in the half addressed SRAM cell (5004). Next, step (6042) is to optionally pre-charge the bit-bar line (5058) in the half addressed SRAM cell (5004) to a high voltage. Subsequently, step (6044) is to optionally float the bit-bar line (5058) in the half addressed SRAM cell (5004). Then, step (6046) is to pre-charge the bit line (5052) in the half addressed SRAM cell (5004). Next, step (6048) is to optionally float the bit line (5052) in the half addressed SRAM cell (5004). Subsequently, step (6050) is to optionally float the bit-bar line (5030) of the addressed SRAM cell (5002). Then, step (6052) is to bias the bit line (5024) of the addressed SRAM cell (5002). Next, step (6054) is to turn on the bit-side passgate (5022) of the addressed SRAM cell (5002). During a test mode of the single sided write high operation, step (6056) is to determine if a high voltage was successfully transferred to the bit-side data node (5010) and if a data upset occurred in the half-addressed SRAM cell (5004). If the high voltage was successfully transferred and if no data upset occurred, step (6058) is to record a successful single sided write high operation for the addressed SRAM cell (5002). If the high voltage was not successfully transferred or if a data upset occurred, step (6060) is to record a failed single sided write high operation for the addressed SRAM cell (5002). Next, the single sided write high operation is ended (6062). In an alternate embodiment, steps (6034), (6036), (6038), (6040), (6042), (6046) and (6050) may be performed in any order.

Referring back to FIG. 5, during an operation to read a data bit value from the first SRAM cell (5002) to the first bit line (5024), the first SRAM cell (5002) is addressed for reading, and the second SRAM cell (5004) is half-addressed. The source node of the second buffer driver (5056) is floated or biased to an appropriate voltage level for reading, for example Vss in embodiments using NMOS buffer drivers. The source node of the first buffer driver (5028) is floated or biased to an appropriate voltage level for reading, for example Vss in embodiments using NMOS buffer drivers.

The source node of the second auxiliary driver transistor (5060) is biased to a voltage level appropriate for maintaining data stability in half addressed SRAM cells, as recited with respect to the single sided write operation above in reference to FIG. 5. The source node of the first auxiliary driver transistor (5032) is biased to a voltage level appropriate for providing adequate static noise margin in an addressed SRAM cell. In one embodiment of a read operation, the source node of the first auxiliary driver transistor (5032) may be biased to a voltage level below Vdd minus Vtn. In an alternate embodiment, the source node of the first auxiliary driver transistor (5032) may be biased to a voltage level below Vss plus Vtn. In a further embodiment, the source node of the first auxiliary driver transistor (5032) may be biased to a voltage level below Vss.

The second bit line (5052) is typically pre-charged to a voltage level appropriate for maintaining data stability in half addressed SRAM cells, and then optionally floated. In one embodiment of a read operation, the second bit line (5052) may be pre-charged to a voltage level higher than Vss plus Vtn. In an alternate embodiment, the second bit line (5052) may be pre-charged to a voltage level higher than Vdd minus Vtn. The first bit line (5024) is pre-charged to a voltage level appropriate for a read operation, and is then optionally floated. In one embodiment of a read operation, the first bit line (5024) may be biased to a voltage level above Vss plus Vtn. In an alternate embodiment, the first bit line (5024) may be biased to a voltage level above Vdd minus Vtn. The first bit-bar line (5030) and the second bit-bar line (5058) are pre-charged to a high voltage as recited with respect to the single sided write operation above in reference to FIG. 5, and then optionally floated.

The word line (5062) is connected to a voltage source whereby the first bit-side passgate (5022) and the second bit-side passgate (5050) are turned on. In a successful read operation, a voltage level on the first bit-side data node (5010) is transferred to the first bit line (5024). As a result, the data bit is available to other circuits (not shown) connected to the first bit line (5024) and located outside the SRAM array (5000) (such as a sense amplifier). A successful read operation also requires data values in half-addressed SRAM cells to be free of data upsets.

Biasing source nodes of auxiliary driver transistors in addressed SRAM cells as recited above during a read operation may reduce read failures. Furthermore, biasing source nodes of auxiliary driver transistors in half-addressed SRAM cells as recited above during a read operation may reduce data upsets in the half addressed SRAM cells.

Operations to read a data bit value from the first SRAM cell (5002) to the first bit-bar line (5030) may be performed analogously to the read operation described above, with appropriate changes in bit line and word line biases. Source nodes of buffer drivers in addressed SRAM cells are biased to potentials appropriate for read operations, for example Vss in embodiments using NMOS buffer drivers.

Figure 6C:
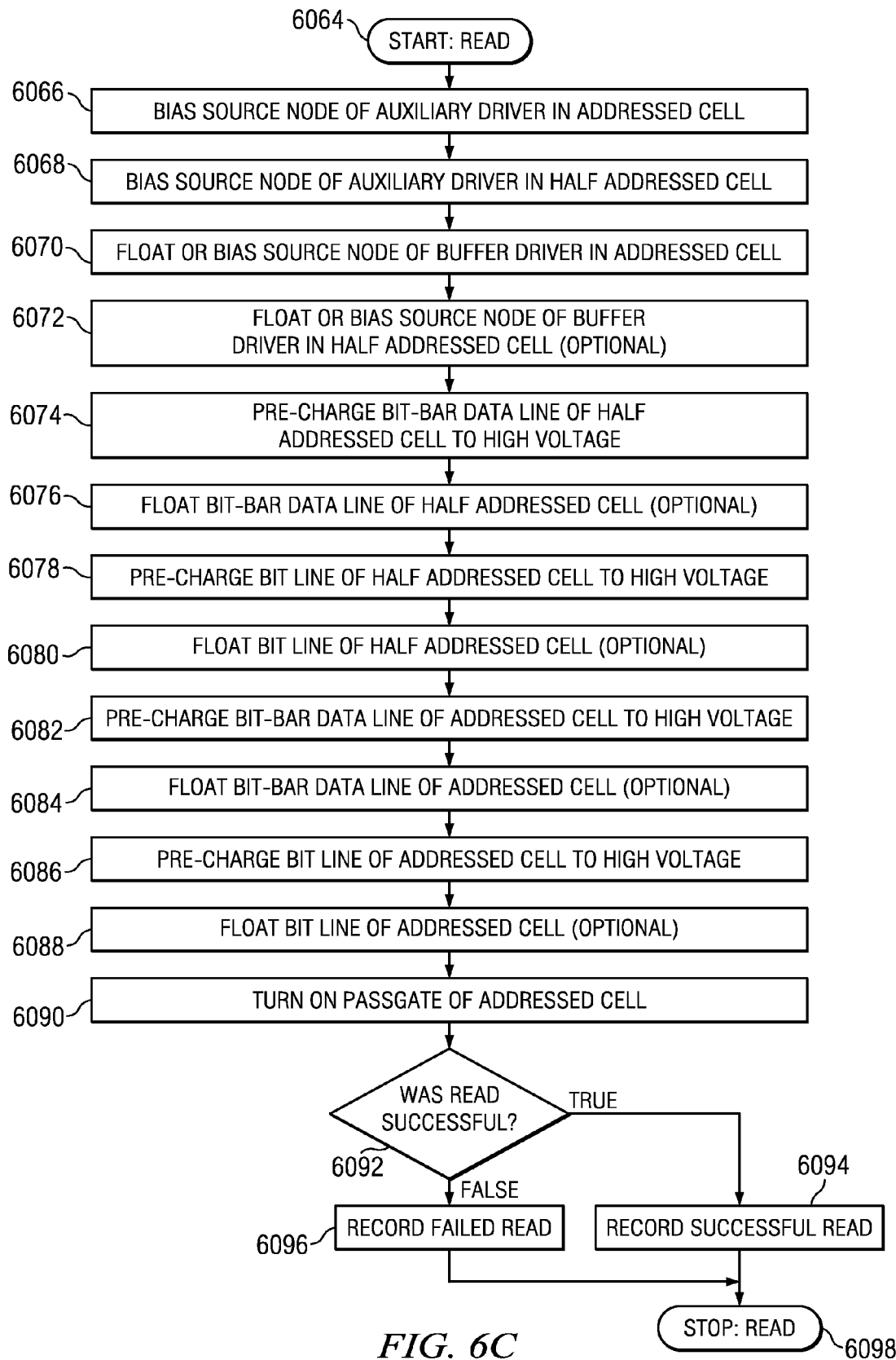

Referring to FIG. 6C, the read operation begins (6064) with step (6066) which is to bias the source node of the auxiliary driver (5032) in the addressed SRAM cell (5002) to improve a static noise margin value in the addressed SRAM cell (5002). Next, step (6068) is to bias the source node of the auxiliary driver (5060) in the half addressed SRAM cell (5004) to improve the static noise margin value in the half addressed SRAM cell (5004). Then, step (6070) is to float or bias the source node of the buffer driver (5028) in the addressed SRAM cell (5004). Subsequently, step (6072) is to optionally float or bias the source node of the buffer driver (5056) in the half addressed SRAM cell (5004). Next, step (6074) is to pre-charge the bit-bar line (5058) of the half addressed SRAM cell (5004) to a high voltage. Then, step (6076) is to optionally float the bit-bar line (5058) of the half addressed SRAM cell (5004). Subsequently, step (6078) is to pre-charge the bit line (5052) of the half addressed SRAM cell (5004) to a high voltage. Then, step (6080) is to optionally float the bit line (5052) of the half addressed SRAM cell (5004). Subsequently, step (6082) is to pre-charge the bit-bar line (5030) of the addressed SRAM cell (5002) to a high voltage. Next, step (6084) is to optionally float the bit-bar line (5030) of the addressed SRAM cell (5002). Subsequently, step (6086) is to pre-charge the bit line (5024) of the addressed SRAM cell (5002) to a high voltage. Next, step (6088) is optionally to float the bit line (5024) of the addressed SRAM cell (5002). Then, step (6090) is to turn on the bit-side passgate (5022) of the addressed SRAM cell (5002). During a test mode of the read operation, step (6092) is to determine if a voltage level on the bit-side data node (5010) was successfully transferred to the bit line (5024) and if a data upset occurred in the half-addressed SRAM cell (5004). If the voltage level was successfully transferred and if no data upset occurred, step (6094) is to record a successful read operation for the addressed SRAM cell (5002). If the voltage level was not successfully transferred or if a data upset occurred, step (6096) is to record a failed read operation for the addressed SRAM cell (5002). Next, the read operation is ended (6098). In an alternate embodiment, steps (6066), (6068), (6070), (6072), (6074), (6078), (6082) and (6086) may be performed in any order.

Referring back to FIG. 5, in a standby mode, the source node of the first buffer driver (5028) and the source node of the second buffer driver (5056) are floated. The source node of the first auxiliary driver transistor (5032) and the source node of the second auxiliary driver transistor (5060) are floated. The first bit line (5024), the first bit-bar line (5030), the second bit line (5052) and the second bit-bar line (5058) are floated. The first word line (5062) and the read-only word line (5064) are connected to a voltage source whereby the first bit-side passgate (5022), the first bit-bar-side access transistor (5026), the second bit-side passgate (5050) and the second bit-bar-side access transistor (5054) are turned off. Floating source nodes of auxiliary drivers during standby mode may reduce leakage current through the auxiliary drivers.

Figure 6D:
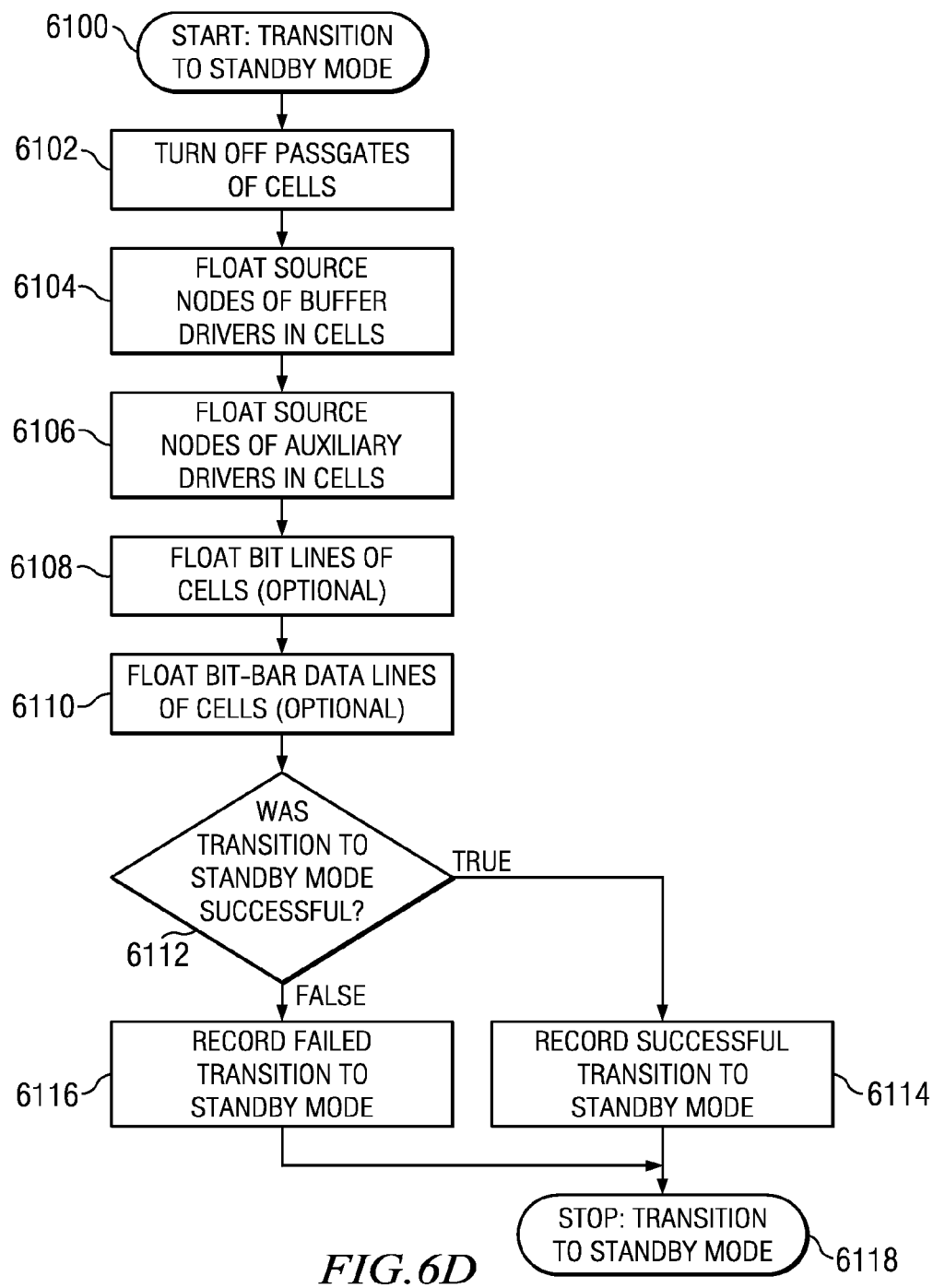

Referring to FIG. 6D, the transition to standby mode begins (6100) with step (6102) which is to turn off the bit-side passgates (5022, 5050) and bit-bar-side access transistors (5026, 5054) of the SRAM cells (5002, 5004). Next, step (6104) is to float the source nodes of the buffer drivers (5028, 5056) of the SRAM cells (5002, 5004). Then, step (6106) is to float the source nodes of the auxiliary drivers (5032, 5060) to reduce leakage current through the auxiliary drivers (5032, 5060). Subsequently, step (6108) is to optionally float the bit lines (5024, 5052) of the SRAM cells (5002, 5004). Next, step (6110) is to optionally float the bit-bar lines (5030, 5058) of the SRAM cells (5002, 5004). During a test mode of the transition to standby mode operation, such as modes including measurements of leakage currents in SRAM cell arrays, step (6112) is to determine if the transition to standby mode was successful, for example if leakage currents were below target values. If the transition to standby mode was successful, step (6114) is to record a successful transition to standby mode operation for the SRAM cells (5002, 5004). If the transition to standby mode was not successful, step (6116) is to record a failed transition to standby mode operation for the SRAM cells (5002, 5004). Next, the transition to standby mode operation is ended (6118). In an alternate embodiment, steps (6104), (6106), (6108) and (6110) may be performed in any order.

Figure 7:
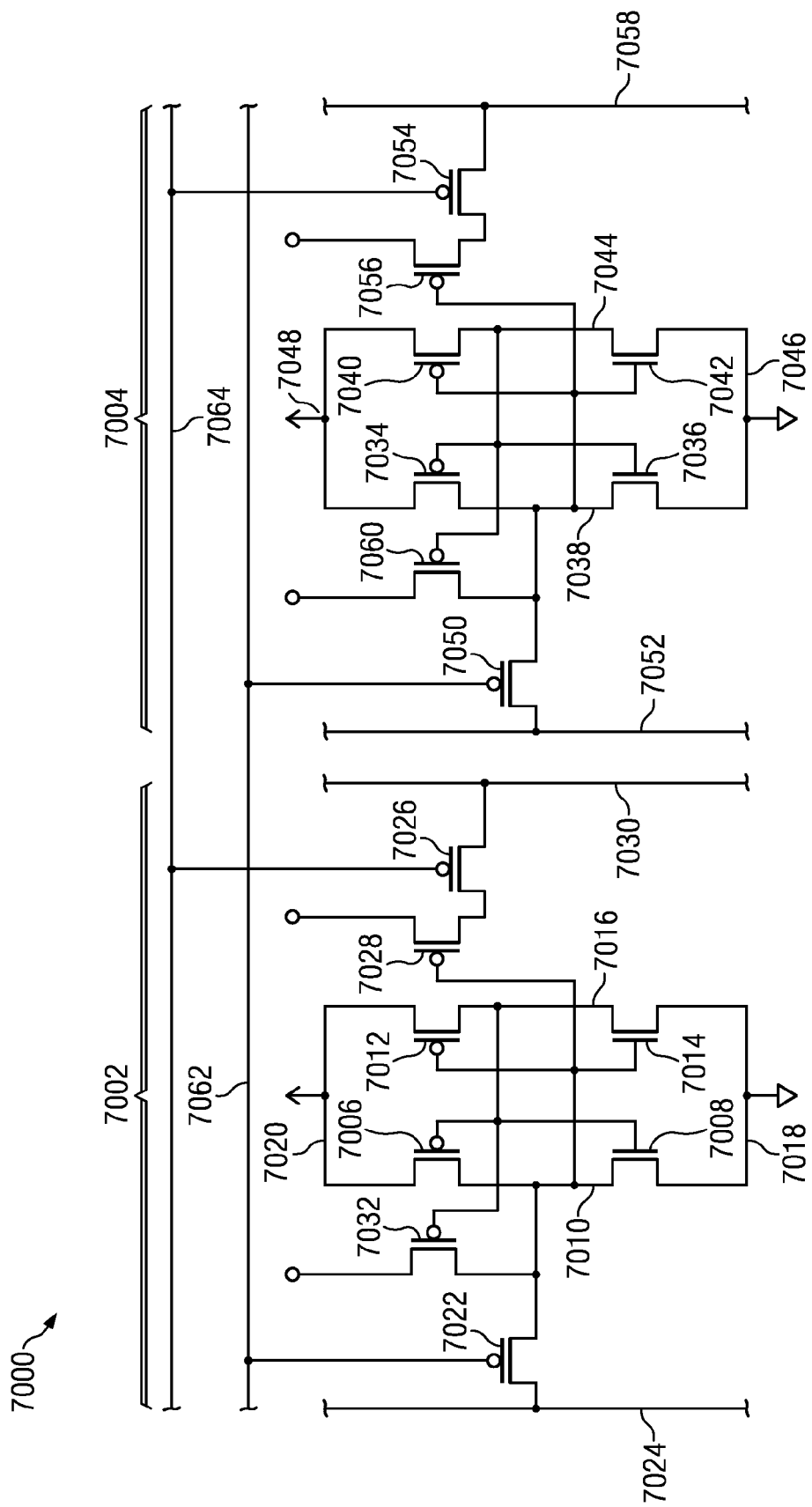
FIG. 7 is a circuit diagram of SRAM cells formed according to a fourth embodiment.

FIG. 7 is a circuit diagram of SRAM cells formed according to a fourth embodiment. An integrated circuit contains an SRAM cell array (7000) further containing a first SRAM cell (7002) and a second SRAM cell (7004). The first SRAM cell (7002) includes a PMOS first bit driver (7006) and an NMOS first bit load (7008). A drain node of the first bit driver (7006) and a drain node of the first bit load (7008) are connected to a first bit-side data node (7010). The first SRAM cell (7002) also includes a PMOS first bit-bar driver (7012) and an NMOS first bit-bar load (7014). A drain node of the first bit-bar driver (7012) and a drain node of the first bit-bar load (7014) are connected to a first bit-bar-side data node (7016). A source node of the first bit load (7008) and a source node of the first bit-bar load (7014) are connected to a first Vss node (7018). A source node of the first bit driver (7006) and a source node of the first bit-bar driver (7012) are connected to a first Vdd node (7020). A gate node of the first bit driver (7006) and a gate node of the first bit load (7008) are connected to the first bit-bar-side data node (7016). Similarly, a gate node of the first bit-bar driver (7012) and a gate node of the first bit-bar load (7014) are connected to the first bit-side data node (7010).

The first SRAM cell (7002) also includes a first bit-side passgate (7022). The first bit-side passgate (7022) is preferably a PMOS transistor as depicted in FIG. 7A, but it may be an NMOS transistor or other switching mechanism. A first source/drain node of the first bit-side passgate (7022) is connected to the first bit-side data node (7010) and a second source/drain node of the first bit-side passgate (7022) is connected to a first bit line (7024). In one embodiment, an on-state current of the first passgate transistor (7022) is between 100 percent and 200 percent of an on-state current of the first bit driver (7006).

The first SRAM cell (7002) includes a first read buffer which includes a first bit-bar-side access transistor (7026) and a PMOS first buffer driver (7028). The first bit-bar-side access transistor (7026) is preferably a PMOS transistor as depicted in FIG. 7A, but it may be an NMOS transistor or other switching mechanism. A first source/drain node of the first bit-bar-side access transistor (7026) is connected to a drain node of the first buffer driver (7028) and a second source/drain node of the first bit-bar-side access transistor (7026) is connected to a first bit-bar line (7030). A gate node of the first buffer driver (7028) is connected to the first bit-side data node (7010).

The first SRAM cell (7002) also includes a PMOS first auxiliary driver transistor (7032). A drain node of the first auxiliary driver transistor (7032) is connected to the first bit-side data node (7010). A gate node of the first auxiliary driver transistor (7032) is connected to the first bit-bar-side data node (7016). In one embodiment, an on-state current of the first auxiliary driver transistor (7032) is between 75 percent and 200 percent of an on-state current of the first passgate transistor (7022). In an alternate embodiment, the first auxiliary driver transistor (7032) may have a threshold voltage magnitude which is more than 50 millivolts lower than a threshold voltage magnitude of the first bit driver (7006). In a further embodiment, the on-state current of the first auxiliary driver transistor (7032) may be higher than an on-state current of the first bit load (7008).

The second SRAM cell (7004) includes a second bit driver (7034) and a second bit load (7036); a drain node of the second bit driver (7034) and a drain node of the second bit load (7036) are connected to a second bit-side data node (7038). The second SRAM cell (7004) includes a second bit-bar driver (7040) and a second bit-bar load (7042); a drain node of the second bit-bar driver (7040) and a drain node of the second bit-bar load (7042) are connected to a second bit-bar-side data node (7044). A source node of the second bit load (7036) and a source node of the second bit-bar load (7042) are connected to a second Vss node (7046). A source node of the second bit driver (7034) and a source node of the second bit-bar driver (7040) are connected to a second Vdd node (7048). A gate node of the second bit driver (7034) and a gate node of the second bit load (7036) are connected to the second bit-bar-side data node (7044). A gate node of the second bit-bar driver (7040) and a gate node of the second bit-bar load (7042) are connected to the second bit-side data node (7038).

The second SRAM cell (7004) also includes a second bit-side passgate (7050). A first source/drain node of the second bit-side passgate (7050) is connected to the second bit-side data node (7038) and a second source/drain node of the second bit-side passgate (7050) is connected to a second bit line (7052).

The second SRAM cell (7004) includes a second read buffer which includes a second bit-bar-side access transistor (7054) and a second buffer driver (7056). A first source/drain node of the second bit-bar-side access transistor (7054) is connected to a drain node of the second buffer driver (7056) and a second source/drain node of the second bit-bar-side access transistor (7054) is connected to a second bit-bar line (7058). A gate node of the second buffer driver (7056) is connected to the second bit-side data node (7038). In alternate embodiments, read buffers may be formed with NMOS buffer driver transistors.

The second SRAM cell (7004) also includes a second auxiliary driver transistor (7060). A drain node of the second auxiliary driver transistor (7060) is connected to the second bit-side data node (7038). A gate node of the second auxiliary driver transistor (7054) is connected to the second bit-bar-side data node (7044).

A gate node of the first bit-side passgate (7022) and a gate node of the second bit-side passgate (7050) connected to a first word line (7062). A gate node of the first bit-bar-side access transistor (7026) and a gate node of the second bit-bar-side access transistor (7054) are connected to a read-only word line (7064). In some embodiments, the read-only word line (7064) may be identical with the first word line (7062). It is common for the first bit line (7024) to be connected to bit-side passgates in other SRAM cells (not shown) in a same column as the first SRAM cell (7002). It is also common for the first bit-bar line (7030) to be connected to bit-bar-side access transistors in other SRAM cells (not shown) in a same column as the first SRAM cell (7002). Similarly, it is common for the second bit line (7052) to be connected to bit-side passgates in other SRAM cells (not shown) in a same column as the second SRAM cell (7004), and it is common for the second bit-bar line (7058) to be connected to bit-bar-side access transistors in other SRAM cells (not shown) in a same column as the second SRAM cell (7004). Furthermore, it is common for the first word line (7062) and the read-only word line (7064) to be connected to passgates in other SRAM cells (not shown) in a same row as the first SRAM cell (7002) and the second SRAM cell (7004).

In one embodiment, the driver transistors (7006, 7012, 7034, 7040) and the load transistors (7008, 7014, 7036, 7042) are a minimum width consistent with fabrication methods used to manufacture the SRAM array (7000). Minimizing driver and load transistor widths may reduce a size of the SRAM array (7000) and thereby possibly reduce manufacturing costs per SRAM array.

In another embodiment, a threshold voltage magnitude of the first bit-bar driver (7012) may be between a product of Vdd minus Vss times a ratio of an on-state current of the first passgate (7022) to an on-state current of the first bit driver (7006) and a product of Vdd minus Vss times a ratio of the on-state current of the first passgate (7022) to a sum of the on-state current of the first bit driver (7006) and an on-state current of the first auxiliary driver transistor (7032), possibly reducing leakage current in the first bit-bar driver (7012).

In an alternate embodiment, the driver transistors (7006, 7012, 7034, 7040), the load transistors (7008, 7014, 7036, 7042) and the auxiliary driver transistors (7032, 7060) may be finFET transistors. Forming the SRAM array (7000) with finFET transistors may reduce a size of the SRAM array (7000) and thereby possibly reduce manufacturing costs per SRAM array.

During an operation to write a data bit to the first SRAM cell (7002), the first SRAM cell (7002) is addressed for writing, and the second SRAM cell (7004) is half-addressed. A source node of the second auxiliary driver transistor (7060) is connected to a voltage level appropriate for maintaining data stability in half addressed SRAM cells. In one embodiment, the source node of the second auxiliary driver transistor (7060) may be biased to a voltage level higher than Vss plus Vtp. In an alternate embodiment, the source node of the second auxiliary driver transistor (7060) may be biased to a voltage level higher than Vdd minus Vtp. In a further embodiment, the source node of the second auxiliary driver transistor (5060) may be biased to a voltage level higher than Vdd.

The second bit line (7052) is pre-charged to a voltage level appropriate for maintaining data stability in half addressed SRAM cells, and then optionally floated. In one embodiment of a single sided write operation, the second bit line (7052) may be pre-charged to a voltage level lower than Vdd minus Vtp. In an alternate embodiment, the second bit line (5052) may be pre-charged to a voltage level lower than Vss plus Vtp.

The second bit-bar line (7058) may be pre-charged to a low voltage, for example below Vdd minus Vtp, and then optionally floated. A source node of the second buffer driver (7056) may be biased or floated. The first bit-bar line (7030) may be pre-charged to a low voltage, for example below Vdd minus Vtp, and then optionally floated. A source node of the first buffer driver (7028) may be biased or floated.

A source node of the first auxiliary driver transistor (7032) may be floated or may be connected to a voltage level appropriate for providing adequate write margin in an addressed SRAM cell. In one embodiment of a single sided write low operation, the source node of the first auxiliary driver transistor (7032) may be biased to a voltage level below Vdd minus Vtp. In an alternate embodiment of a single sided write low operation, the source node of the first auxiliary driver transistor (7032) may be biased to a voltage level below Vss plus Vtp. In a further embodiment of a single sided write low operation, the source node of the first auxiliary driver transistor (7032) may be biased to a voltage level below Vss.

In one embodiment of a single sided write high operation, the source node of the first auxiliary driver transistor (7032) may be biased to a voltage level above Vss plus Vtp. In an alternate embodiment of a single sided write high operation, the source node of the first auxiliary driver transistor (5032) may be biased to a voltage level above Vdd minus Vtp. In a further embodiment of a single sided write high operation, the source node of the first auxiliary driver transistor (5032) may be biased to a voltage level above Vdd.

The first bit line (7024) is biased to a voltage level appropriate for providing adequate write margin in an addressed SRAM cell, which depends on a voltage (that is a low voltage or a high voltage) of the data bit being written. In one embodiment of a single sided write low operation, the first bit line (7024) may be biased to a voltage level below Vdd minus Vtp. In an alternate embodiment of a single sided write low operation, the first bit line (7024) may be biased to a voltage level below Vss plus Vtp. In one embodiment of a single sided write high operation, the first bit line (7024) may be biased to a voltage level above Vss plus Vtp. In an alternate embodiment of a single sided write high operation, the first bit line (7024) may be biased to a voltage level above Vdd minus Vtp.

The word line (7062) is connected to a voltage source (not shown) whereby the first bit-side passgate (7022) and the second bit-side passgate (7050) are turned on. In a successful write operation, a voltage level on the first bit line (7024) is transferred to the first bit-side data node (7010) and a desired voltage level on the first bit-side data node (7010) becomes stabilized.

Floating or biasing source nodes of auxiliary driver transistors in addressed SRAM cells during a single sided write operation as recited herein reduce write failures. Furthermore, biasing source nodes of auxiliary driver transistors in half-addressed SRAM cells as recited herein during a single sided write operation may reduce data upsets in the half addressed SRAM cells.

FIG. 8A through FIG. 8D are flowcharts of a single sided write low operation, a single sided write high operation, a read operation, and a transition to standby mode, respectively.

Figure 8A:
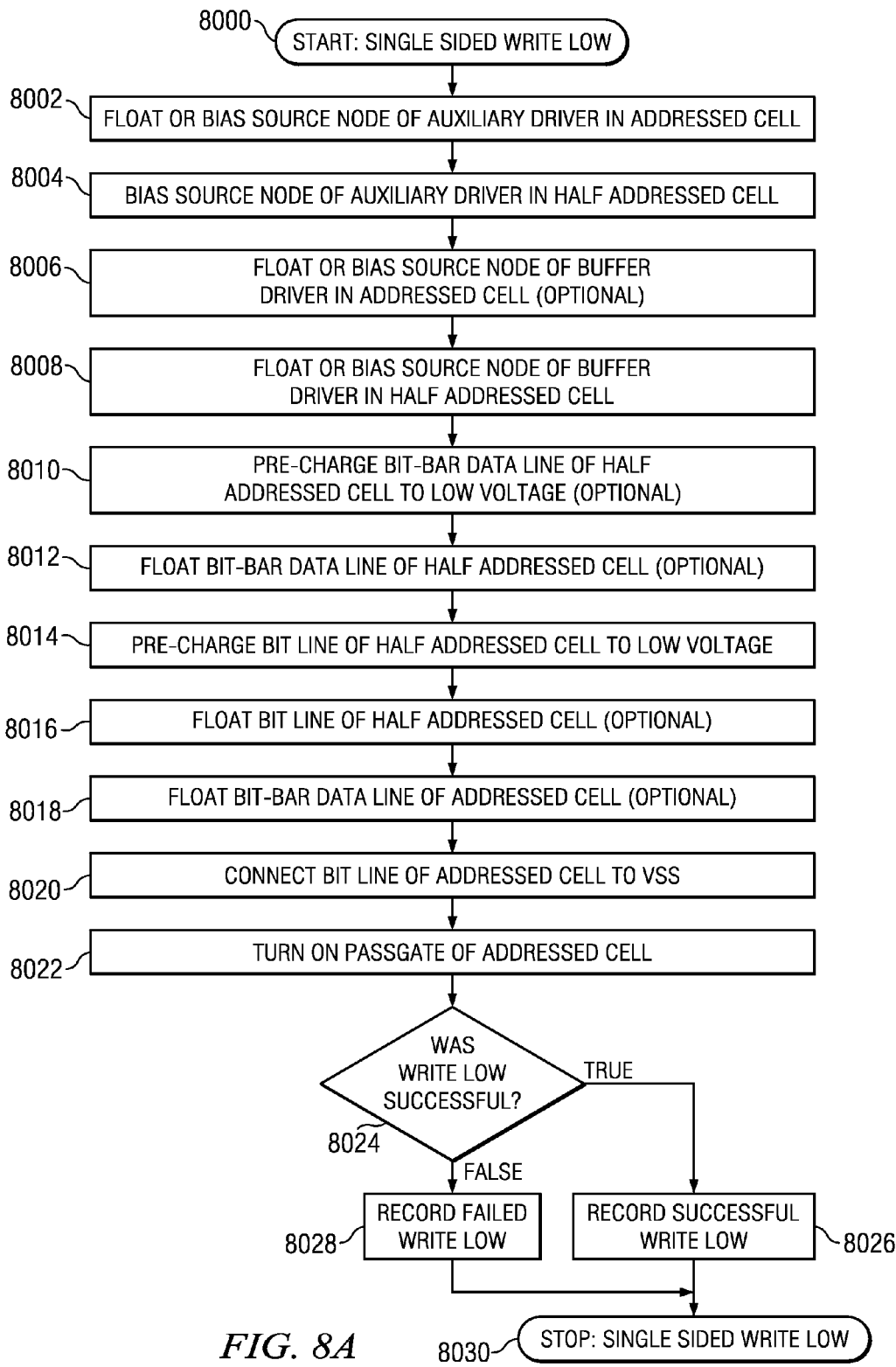
FIG. 8A through FIG. 8D are flowcharts of a first data bit value write operation, a second data bit value write operation, a read operation, and a transition to standby mode, respectively, for the fourth embodiment.

The flowcharts in FIG. 8A through FIG. 8D refer to the SRAM array depicted in FIG. 7. Referring to FIG. 8A, the single sided write low operation begins (8000) with step (8002) which is to float or bias the source node of the auxiliary driver (7032) in the addressed SRAM cell (7002) to improve a write low margin in the addressed SRAM cell (7002). Then, step (8004) is to bias the source nodes of the auxiliary driver (7060) in the half addressed SRAM cell (7004) to improve a static noise margin value in the half addressed SRAM cell (7004). Next, step (8006) is to optionally bias or float the source node of the buffer driver (7028) in the addressed SRAM cell (7002). Subsequently, step (8008) is to optionally float or bias the source node of the buffer driver (7056) in the half addressed SRAM cell (7004). Next, step (8010) is to optionally pre-charge the bit-bar line (7058) of the half addressed SRAM cell (7004) to a low voltage. Subsequently, step (8012) is to optionally float the bit-bar line (7058) in the half addressed SRAM cell (7004). Then, step (8014) is to pre-charge the bit line (7052) in the half addressed SRAM cell (7004) to a low voltage. Next, step (8016) is to optionally float the bit line (7052) in the half addressed SRAM cell (7004). Subsequently, step (8018) is to optionally float the bit-bar line (7030) of the addressed SRAM cell (7002). Then, step (8020) is to bias the bit line (7024) of the addressed SRAM cell (7002) to Vss. Next, step (8022) is to turn on the bit-side passgate (7022) of the addressed SRAM cell (7002). During a test mode of the single sided write low operation, step (8024) is to determine if a low voltage was successfully transferred to the bit-side data node (7010) and if a data upset occurred in the half-addressed SRAM cell (7004). If the low voltage was successfully transferred and if no data upset occurred, step (8026) is to record a successful single sided write low operation for the addressed SRAM cell (7002). If the low voltage was not successfully transferred or if a data upset occurred, step (8028) is to record a failed single sided write low operation for the addressed SRAM cell (7002). Next, the single sided write low operation is ended (8030). In an alternate embodiment, steps (8002), (8004), (8006), (8008), (8010), (8014) and (8018) may be performed in any order.

Figure 8B:
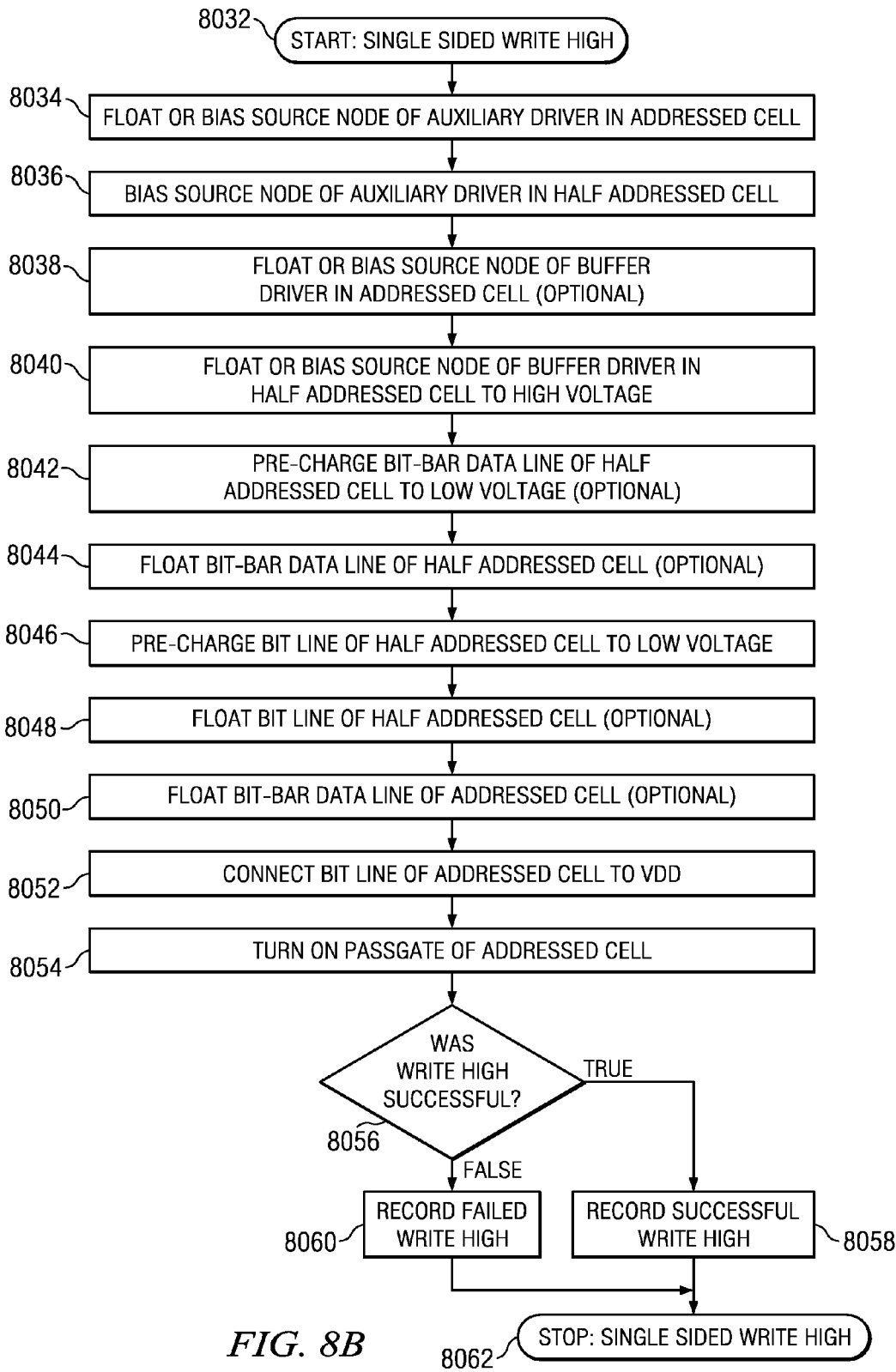

Referring to FIG. 8B, the single sided write high operation begins (8032) with step (8034) which is to float or bias the source node of the auxiliary driver (7032) in the addressed SRAM cell (7002) to improve a write high margin in the addressed SRAM cell (7002). Next, step (8036) is to bias the source node of the auxiliary driver (7060) in the half addressed SRAM cell (7004) to improve the static noise margin value in the half-addressed SRAM cell (7004). Then, step (8038) is to optionally float or bias the source node of the buffer driver (7028) in the addressed SRAM cell (7002). Subsequently, step (8040) is to optionally float or bias the source node of the buffer driver (7056) in the half addressed SRAM cell (7004). Subsequently, step (8042) is to optionally pre-charge the bit-bar line (7058) in the half addressed SRAM cell (7004) to a low voltage. Next, step (8044) is to optionally float the bit-bar line (7058) in the half addressed SRAM cell (7004). Then, step (8046) is to pre-charge the bit line (7052) in the half addressed SRAM cell (7004) to a low voltage. Next, step (8048) is to optionally float the bit line (7052) in the half addressed SRAM cell (7004). Subsequently, step (8050) is to optionally float the bit-bar line (7030) of the addressed SRAM cell (7002). Next, step (8052) is to bias a bit line (7024) of the addressed SRAM cell (7002) to Vdd. Then, step (8054) is to turn on the bit-side passgate (7022) of the addressed SRAM cell (7002). During a test mode of the single sided write high operation, step (8056) is to determine if a high voltage was successfully transferred to the bit-side data node (7010) and if a data upset occurred in the half-addressed SRAM cell (7004). If the high voltage was successfully transferred and if no data upset occurred, step (8058) is to record a successful single sided write high operation for the addressed SRAM cell (7002). If the high voltage was not successfully transferred or if a data upset occurred, step (8060) is to record a failed single sided write high operation for the addressed SRAM cell (7002). Next, the single sided write high operation is ended (8062). In an alternate embodiment, steps (8034), (8036), (8038), (8040), (8042), (8046) and (8050) may be performed in any order.

Referring back to FIG. 7 during an operation to read a data bit value from the first SRAM cell (7002) to the first bit line (7024), the first SRAM cell (7002) is addressed for reading, and the second SRAM cell (7004) is half-addressed. The source node of the second buffer driver (7056) is floated or biased to an appropriate voltage level for reading, for example Vdd in embodiments using PMOS buffer drivers. The source node of the first buffer driver (7028) is floated or biased to an appropriate voltage level for reading, for example Vdd in embodiments using PMOS buffer drivers.

The source node of the second auxiliary driver transistor (7060) is biased to a voltage level appropriate for maintaining data stability in half addressed SRAM cells, as recited with respect to the single sided write operation above in reference to FIG. 7. The source node of the first auxiliary driver transistor (7032) is biased to a voltage level appropriate for providing adequate static noise margin in an addressed SRAM cell. In one embodiment of a read operation, the source node of the first auxiliary driver transistor (7032) may be biased to a voltage level above Vss plus Vtp. In an alternate embodiment, the source node of the first auxiliary driver transistor (7032) may be biased to a voltage level above Vdd minus Vtp. In a further embodiment, the source node of the first auxiliary driver transistor (7032) may be biased to a voltage level above Vdd.

The second bit line (7052) is typically pre-charged to a voltage level appropriate for maintaining data stability in half addressed SRAM cells, and then optionally floated. In one embodiment of a read operation, the second bit line (7052) may be pre-charged to a voltage level lower than Vdd minus Vtp. In an alternate embodiment, the second bit line (7052) may be pre-charged to a voltage level lower than Vss plus Vtp. The first bit line (7024) is pre-charged to a voltage level appropriate for a read operation, and is then optionally floated. In one embodiment of a read operation, the first bit line (7024) may be biased to a voltage level below Vdd minus Vtp. In an alternate embodiment, the first bit line (7024) may be biased to a voltage level below Vss plus Vtp. The first bit-bar line (7030) and the second bit-bar line (7058) are pre-charged to a low voltage as recited with respect to the single sided write operation above in reference to FIG. 7, and then optionally floated.

The word line (7062) is connected to a voltage source whereby the first bit-side passgate (7022) and the second bit-side passgate (7050) are turned on. In a successful read operation, a voltage level on the first bit-side data node (7010) is transferred to the first bit line (7024). As a result, the data bit is available to other circuits (not shown) connected to the first bit line (7024) but located outside the SRAM array (7000) (such as a sense amplifier). A successful read operation also requires data values in half-addressed SRAM cells to be free of data upsets.

Biasing source nodes of auxiliary driver transistors in addressed SRAM cells as recited above during a read operation may reduce read failures. Furthermore, biasing source nodes of auxiliary driver transistors in half-addressed SRAM cells as recited above during a read operation may reduce data upsets in the half addressed SRAM cells.

Operations to read a data bit value from the first SRAM cell (7002) to the first bit-bar line (7030) may be performed analogously to the read operation described above, with appropriate changes in bit line and word line biases. Source nodes of buffer drivers in addressed SRAM cells are biased to potentials appropriate for read operations, for example Vdd in embodiments using PMOS buffer drivers.

Figure 8C:
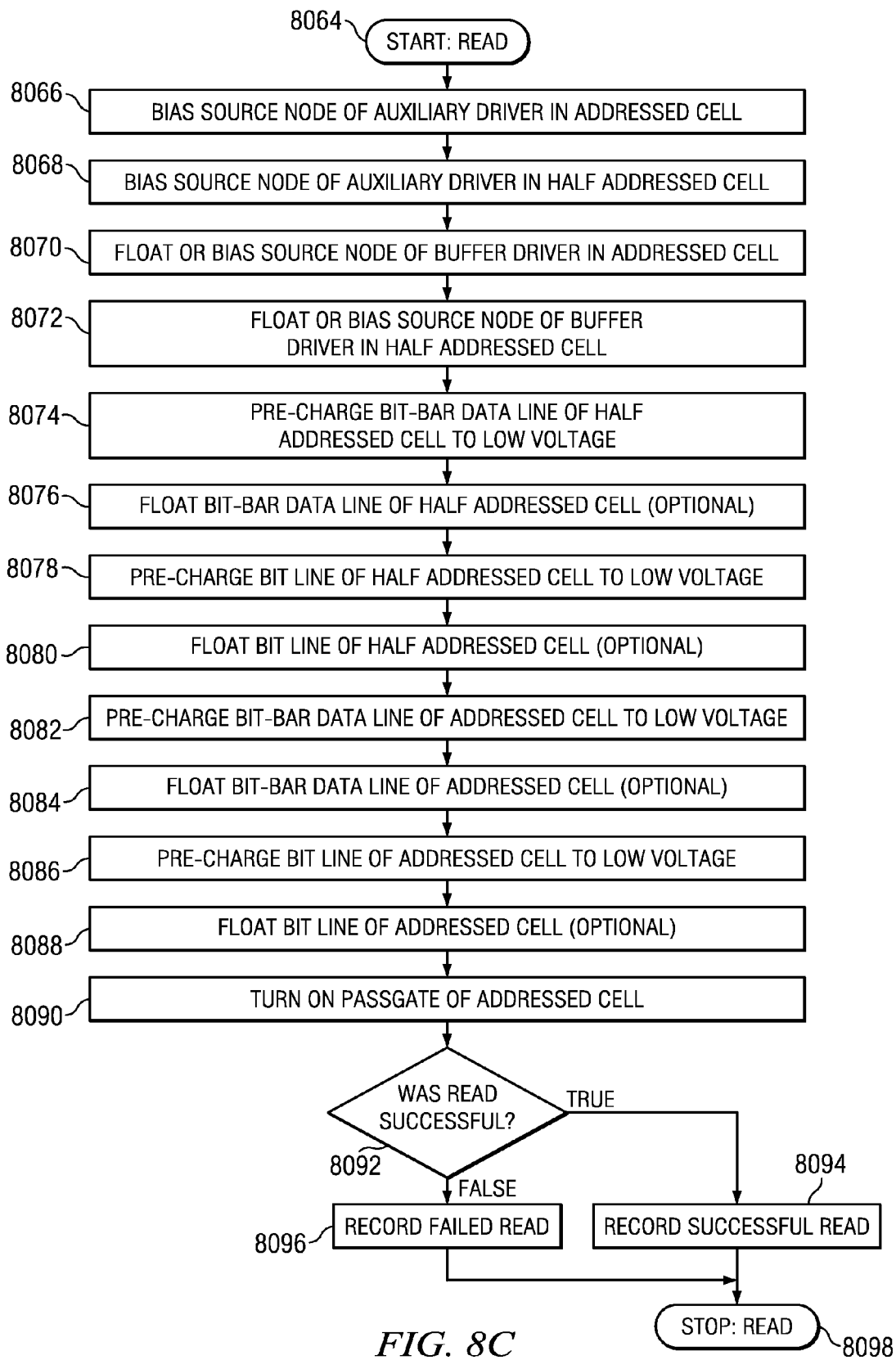

Referring to FIG. 8C, the read operation begins (8064) with step (8066) which is to bias the source node of the auxiliary driver (7032) in the addressed SRAM cell (7002) to improve a static noise margin value in the addressed SRAM cell (7002). Next, step (8068) is to bias the source node of the auxiliary driver (7060) in the half addressed SRAM cell (7004) to improve the static noise margin value in the half addressed SRAM cell (7004). Subsequently, step (8070) is to float or bias the source node of the buffer driver (7028) in the addressed SRAM cell (7002). Then, step (8072) is to optionally float or bias the source node of the buffer driver (7056) in the half addressed SRAM cell (7004). Subsequently, step (8074) is to pre-charge the bit-bar line (7058) of the half addressed SRAM cell (7004) to a low voltage. Next, step (8076) is to optionally float the bit-bar line (7058) of the half addressed SRAM cell (7004). Then, step (8078) is to pre-charge the bit line (7052) of the half addressed SRAM cell (7004) to a low voltage. Next, step (8080) is to optionally float the bit line (7052) of the half addressed SRAM cell (7004). Subsequently, step (8082) is to pre-charge the bit-bar line (7030) of the addressed SRAM cell (7002) to a low voltage. Then, step (8084) is to optionally float the bit-bar line (7030) of the addressed SRAM cell (7002). Subsequently, step (8086) is to pre-charge the bit line (7024) of the addressed SRAM cell (7002) to a low voltage. Next, step (8088) is to optionally float the bit line (7024) of the addressed SRAM cell (7002). Then, step (8090) is to turn on the bit-side passgate (7022) of the addressed SRAM cell (7002). During a test mode of the read operation, step (8092) is to determine if a voltage level on the bit-side data node (7010) was successfully transferred to the bit line (7024) and if a data upset occurred in the half-addressed SRAM cell (7004). If the voltage level was successfully transferred and if no data upset occurred, step (8094) is to record a successful read operation for the addressed SRAM cell (7002). If the voltage level was not successfully transferred or if a data upset occurred, step (8096) is to record a failed read operation for the addressed SRAM cell (7002). Next, the read operation is ended (8098). In an alternate embodiment, steps (8066), (8068), (8070), (8072), (8074), (8078), (8082) and (8086) may be performed in any order.

Referring back to FIG. 7, in a standby mode, the source node of the first buffer driver (7028) and the source node of the second buffer driver (7056) are floated. The source node of the first auxiliary driver transistor (7032) and the source node of the second auxiliary driver transistor (7060) are floated. The first bit line (7024), the first bit-bar line (7030), the second bit line (7052) and the second bit-bar line (7058) are floated. The first word line (7062) and the read-only word line (7064) are connected to a voltage source whereby the first bit-side passgate (7022), the first bit-bar-side access transistor (7026), the second bit-side passgate (7050) and the second bit-bar-side access transistor (7054) are turned off. Floating source nodes of auxiliary drivers during standby mode may reduce the leakage current through the auxiliary drivers.

Figure 8D:
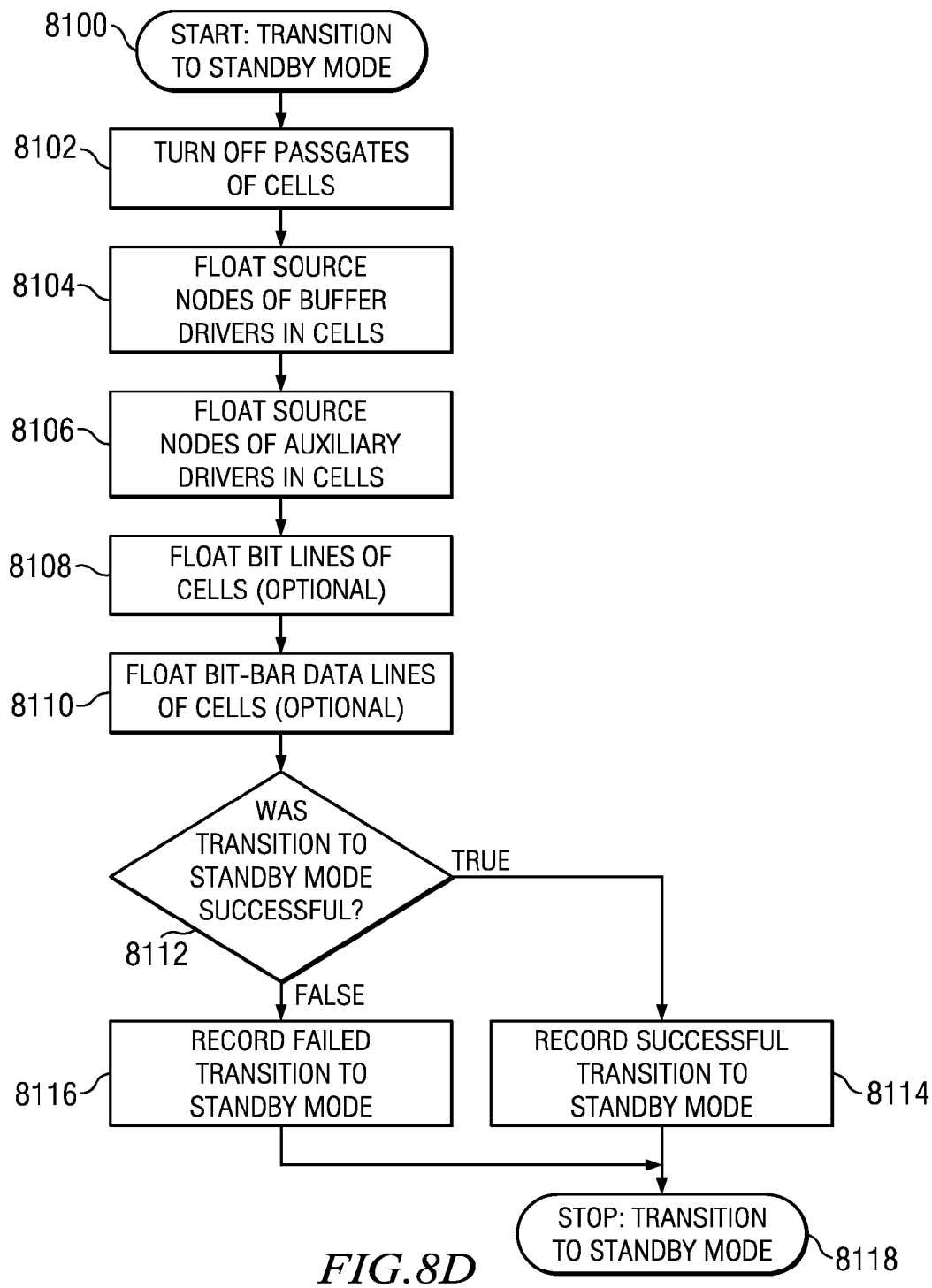

Referring to FIG. 8D, the transition to standby mode begins (8100) with step (8102) which is to turn off the bit-side passgates (7022, 7050) and bit-bar-side access transistors (7026, 7054) of the SRAM cells (7002, 7004). Next, step (8104) is to float the source nodes of the buffer drivers (7028, 7056) of the SRAM cells (7002, 7004). Then, step (8106) is to float the source node of the auxiliary drivers (7032, 7060) to reduce leakage current through the auxiliary drivers (7032, 7060). Next, step (8108) is to optionally float bit lines (7024, 7052) of the SRAM cells (7002, 7004). Subsequently, step (8110) is to optionally float the bit-bar lines (7030, 7058) of the SRAM cells (7002, 7004). During a test mode of the transition to standby mode operation (such as modes including measurements of leakage currents in SRAM cell arrays) step (8112) is to determine if the transition to standby mode was successful (for example if leakage currents were below target values). If the transition to standby mode was successful, step (8114) is to record a successful transition to standby mode operation for the SRAM cells (7002, 7004). If the transition to standby mode was not successful, step (8116) is to record a failed transition to standby mode operation for the SRAM cells (7002, 7004). Next, the transition to standby mode operation is ended (8118). In an alternate embodiment, steps (8104), (8106), (8108) and (8110) may be performed in any order.

It will be recognized by those familiar with SRAM design and fabrication that other configurations of single sided write SRAM cells may benefit from inclusion of auxiliary drivers as described in reference to the embodiments disclosed herein.

Figure 9:
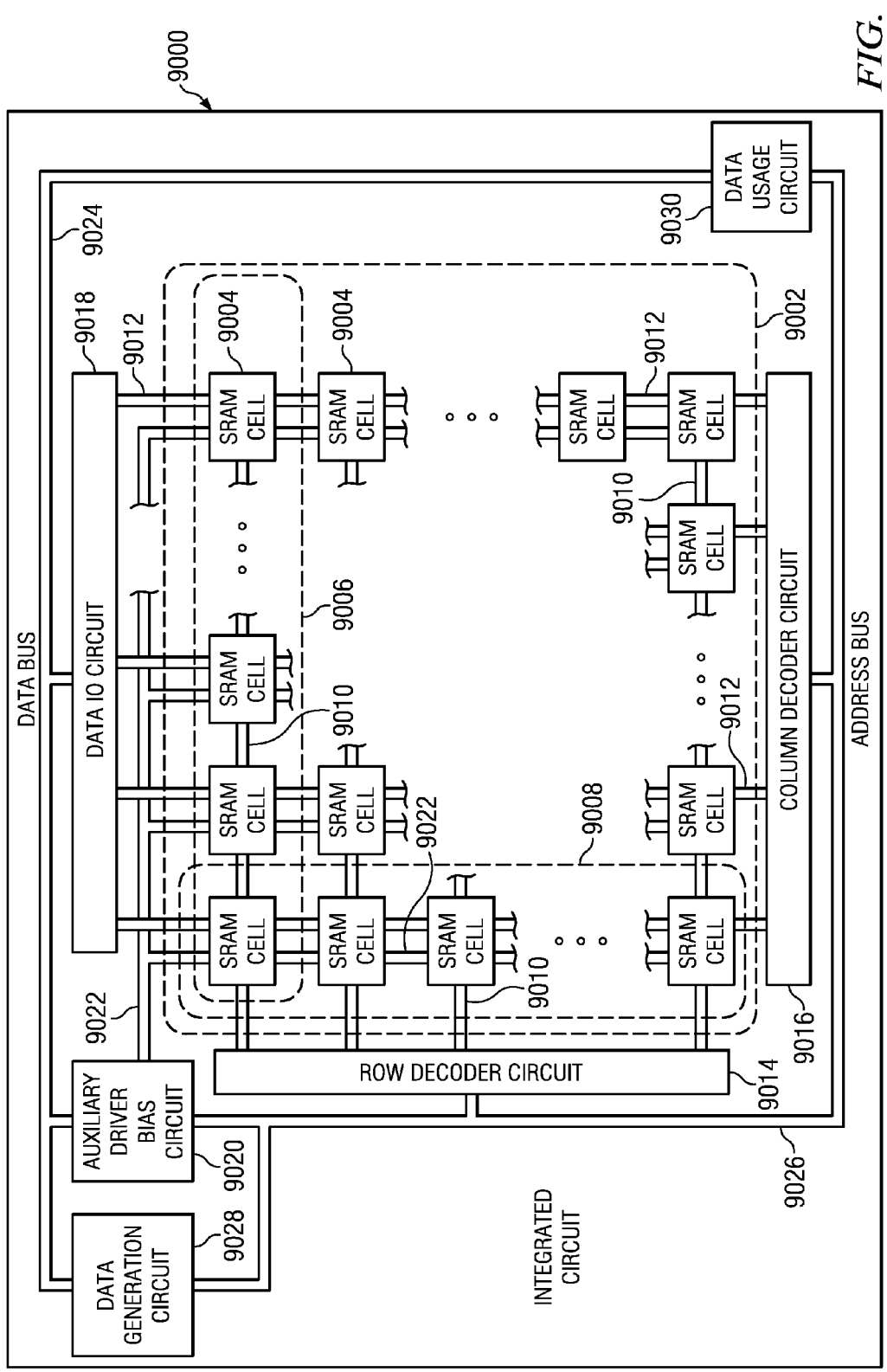
FIG. 9 depicts an integrated circuit containing an SRAM cell array which includes SRAM cells formed according an example embodiment.

FIG. 9 depicts an integrated circuit (9000) containing an SRAM cell array (9002) which includes SRAM cells (9004) formed according to an embodiment. The SRAM cells (9004) are arranged in rows (9006) and columns (9008). Each word line bus (9010) is connected to SRAM cells (9004) in a row (9006). Each word line bus (9010) may include more than one word line. Each bit line bus (9012) is connected to SRAM cells (9004) in a column (9008). Each bit line bus (9012) may include one or more bit lines and bit-bar lines. A row decoder circuit (9014) applies appropriate biases to word lines in the word line buses (9010). A column decoder circuit (9016) applies appropriate biases to bit lines and bit-bar lines in the bit line buses (9012). A data input/output (10) circuit (9018) reads data from the bit lines or bit-bar lines in the bit line buses (9012) during read operations and applies appropriate potentials to the bit or bit-bar lines in the bit line buses (9012) during write operations. An auxiliary driver transistor bias circuit (9020) is configured to apply biases to an auxiliary driver bus (9022) which is connected to read auxiliary transistors in the SRAM cells (9004). The auxiliary driver transistor bias circuit (9020) may be capable of biasing the auxiliary driver transistors independently by column during single sided write low operations, single sided write high operations, read operations and transition to standby operations as described in reference to FIG. 1, FIG. 3, FIG. 5, and FIG. 7. Thereby, a different voltage level is provided to a source node of an auxiliary driver transistor in an addressed SRAM cell (9004) than a voltage level provided to a source node of an auxiliary driver transistor in a half addressed SRAM cell (9004). The integrated circuit further includes a data bus (9024) which carries data bits between the SRAM cell array (9002) and other circuits in the integrated circuit (9000), and an address bus (9026) which is used to select SRAM cells (9004) in the SRAM cell array (9002) for read and write operations. The address bus (9026) is connected to the row decoder circuit (9014), the column decoder circuit (9016) and the auxiliary driver transistor bias circuit (9020). The integrated circuit (9000) may also contain a data generation circuit (9028) which connects to the data bus (9024) and address bus (9026). The data generation circuit (9028) produces incoming data bits for storage in the SRAM cell array (9002). The data bus (9024) carries the incoming data bits from the data generation circuit (9028) to the SRAM cell array (9002). The integrated circuit (9000) may also contain a data usage circuit (9030) which connects to the data bus (9024) and address bus (9026). The data usage circuit (9030) uses outgoing data bits which were stored in the SRAM cell array (9002). The data bus (9024) carries the outgoing data bits from the SRAM cell array (9002) to the data usage circuit (9030).

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit, comprising:
an array of SRAM cells, each said SRAM cell further including:
a bit-side load transistor; said bit-side load transistor further including a gate node and a drain node;
a bit-side data node, wherein said bit-side data node is coupled to said drain node of said bit-side load transistor;
a bit-side driver transistor, said bit-side driver transistor further including a gate node, a drain node and a source node, wherein:
said drain node of said bit-side driver transistor is coupled to said bit-side data node; and
said source node of said bit-side driver transistor is coupled to a driver bias voltage supply configured to provide a first bias voltage level to said source node of said bit-side driver transistor;
a bit-bar-side load transistor; said bit-bar-side load transistor further including a gate node and a drain node, said gate node of said bit-bar-side load transistor is coupled to said bit-side data node;
a bit-bar-side data node, wherein said bit-bar-side data node is coupled to said drain node of said bit-bar-side load transistor, to said gate node of said bit-side load transistor and to said gate node of said bit-side driver transistor, and wherein said bit-bar-side data node is free of a connection to a passgate transistor;
a bit-bar-side driver transistor, said bit-bar-side driver transistor further including a gate node, a drain node and a source node, wherein:
said drain node of said bit-bar-side driver transistor is coupled to said bit-bar-side data node, and said gate node of said bit-bar-side driver transistor is coupled to said bit-side data node; and
said source node of said bit-bar-side driver transistor is coupled to said driver bias voltage supply;
a bit-side passgate transistor, said bit-side passgate transistor further including a gate node, a first source/drain node and a second source/drain node, wherein said gate node of said bit-side passgate transistor is coupled to a word line, said first source/drain node of said bit-side passgate transistor is coupled to said bit-side data node and said second source/drain node of said bit-side passgate transistor is coupled to a bit line; and an auxiliary driver transistor, said auxiliary driver transistor being a same polarity as said bit-side driver transistor, said auxiliary driver transistor further including a gate node, a source node and a drain node, wherein said gate node of said auxiliary driver transistor is coupled to said bit-bar-side data node, and said drain node of said auxiliary driver transistor is coupled to said bit-side data node; and
an auxiliary driver bias control circuit, said auxiliary driver bias control circuit being coupled to said source node of said auxiliary driver transistor in an addressed SRAM cell and to said source node of said auxiliary driver transistor in a half-addressed SRAM cell, such that said auxiliary driver bias control circuit is configured to provide a second bias voltage level to said source node of said auxiliary driver transistor in said addressed SRAM cell and to provide a third bias voltage level to said source node of said auxiliary driver transistor in said half-addressed SRAM cell.

2. The integrated circuit of claim 1, in which:
said bit-side load transistor is a PMOS transistor;
said bit-side driver transistor is an NMOS transistor;
said bit-bar-side load transistor is a PMOS transistor; and
said bit-bar-side driver transistor is an NMOS transistor.

3. The integrated circuit of claim 1, in which:
said bit-side load transistor is an NMOS transistor;
said bit-side driver transistor is a PMOS transistor;
said bit-bar-side load transistor is an NMOS transistor; and
said bit-bar-side driver transistor is a PMOS transistor.

4. The integrated circuit of claim 1, in which a sum of an on-state current of said auxiliary driver transistor and an on-state current of said bit-side driver transistor is greater than an on-state current of said bit-side passgate transistor.

5. The integrated circuit of claim 1, in which a threshold voltage magnitude of said bit-bar-side driver transistor is less than a product of a difference between a voltage level of a source node of said bit-side load transistor and a voltage level of a source node of said bit-side driver transistor times a ratio of an on-state current of said bit-side passgate transistor to an on-state current of said bit-side driver transistor, and said threshold voltage magnitude is also greater than a product of said difference between said voltage level of said source node of said bit-side load transistor and said voltage level of said source node of said bit-side driver transistor times a ratio of said on-state current of said bit-side passgate transistor to a sum of said on-state current of said bit driver transistor and an on-state current of said auxiliary driver transistor.

6. The integrated circuit of claim 1, further including a read buffer, said read buffer further including:
a buffer driver transistor, said buffer driver transistor further including a gate node and a drain node, wherein said gate node of said buffer driver transistor is connected to said bit-side data node; and
a bit-bar-side access transistor, said bit-bar-side access transistor further including a gate node, a first source/drain node and a second source/drain node, wherein said gate node of said bit-bar-side access transistor is connected to a second word line, said first source/drain node of said bit-side passgate transistor is connected to said drain node of said buffer driver transistor and said second source/drain node of said bit-bar-side access transistor is connected to a bit-bar line.

7. The integrated circuit of claim 6, wherein said second word line is said first word line.

8. The integrated circuit of claim 1, in which said auxiliary driver bias control circuit is configured to provide a different voltage level to said source node of said auxiliary driver transistor in said addressed SRAM cell than a voltage level provided to said source node of said auxiliary driver transistor in said half-addressed SRAM cell.

9. An array of SRAM cells, each said SRAM cell comprising:
   a bit-side load transistor; said bit-side load transistor further including a gate node and a drain node;
   a bit-side data node, wherein said bit-side data node is coupled to said drain node of said bit-side load transistor;
   a bit-side driver transistor, said bit-side driver transistor further including a gate node, a drain node and a source node, wherein:
      said drain node of said bit-side driver transistor is coupled to said bit-side data node; and
      said source node of said bit-side driver transistor is coupled to a driver bias voltage supply configured to provide a first bias voltage level to said source node of said bit-side driver transistor;
   a bit-bar-side load transistor; said bit-bar-side load transistor further including a gate node and a drain node, said gate node of said bit-bar-side load transistor is coupled to said bit-side data node;
   a bit-bar-side data node, wherein said bit-bar-side data node is coupled to said drain node of said bit-bar-side load transistor, to said gate node of said bit-side load transistor and to said gate node of said bit-side driver transistor, and wherein said bit-bar-side data node is free of a connection to a passgate transistor;
   a bit-bar-side driver transistor, said bit-bar-side driver transistor further including a gate node, a drain node and a source node, wherein:
      said drain node of said bit-bar-side driver transistor is coupled to said bit-bar-side data node, and said gate node of said bit-bar-side driver transistor is coupled to said bit-side data node; and
      said source node of said bit-bar-side driver transistor is coupled to said driver bias voltage supply;
   a bit-side passgate transistor, said bit-side passgate transistor further including a gate node, a first source/drain node and a second source/drain node, wherein said gate node of said bit-side passgate transistor is coupled to a word line, said first source/drain node of said bit-side passgate transistor is coupled to said bit-side data node and said second source/drain node of said bit-side passgate transistor is coupled to a bit line; and
   an auxiliary driver transistor, said auxiliary driver transistor being a same polarity as said bit-side driver transistor, said auxiliary driver transistor further including a gate node, a source node and a drain node, wherein:
      said gate node of said auxiliary driver transistor is coupled to said bit-bar-side data node;
      said drain node of said auxiliary driver transistor is coupled to said bit-side data node; and
      said source node of said auxiliary driver transistor is coupled to an auxiliary driver bias voltage supply.

10. The array of SRAM cells of claim 9, in which:
    said bit-side load transistor is a PMOS transistor;
    said bit-side driver transistor is an NMOS transistor;
    said bit-bar-side load transistor is a PMOS transistor; and
    said bit-bar-side driver transistor is an NMOS transistor.

11. The array of SRAM cells of claim 9, in which:
    said bit-side load transistor is an NMOS transistor;
    said bit-side driver transistor is a PMOS transistor;
    said bit-bar-side load transistor is an NMOS transistor; and
    said bit-bar-side driver transistor is a PMOS transistor.

12. The array of SRAM cells of claim 9, in which a sum of an on-state current of said auxiliary driver transistor and an on-state current of said bit-side driver transistor is greater than an on-state current of said bit-side passgate transistor.

13. The array of SRAM cells of claim 9, in which a threshold voltage magnitude of said bit-bar-side driver transistor is less than a product of a difference between a voltage level of a source node of said bit-side load transistor and a voltage level of a source node of said bit-side driver transistor times a ratio of an on-state current of said bit-side passgate transistor to an on-state current of said bit-side driver transistor, and said threshold voltage magnitude is also greater than a product of said difference between said voltage level of said source node of said bit-side load transistor and said voltage level of said source node of said bit-side driver transistor times a ratio of said on-state current of said bit-side passgate transistor to a sum of said on-state current of said bit driver transistor and an on-state current of said auxiliary driver transistor.

14. The array of SRAM cells of claim 9, further including a read buffer, said read buffer further including:
    a buffer driver transistor, said buffer driver transistor further including a gate node and a drain node, wherein said gate node of said buffer driver transistor is connected to said bit-side data node; and
    a bit-bar-side access transistor, said bit-bar-side access transistor further including a gate node, a first source/drain node and a second source/drain node, wherein said gate node of said bit-bar-side access transistor is connected to a second word line, said first source/drain node of said bit-side passgate transistor is connected to said drain node of said buffer driver transistor and said second source/drain node of said bit-bar-side access transistor is connected to a bit-bar line.

15. The array of SRAM cells of claim 14, wherein said second word line is said first word line.

16. A process of operating an integrated circuit, comprising:
    writing a data bit value to an addressed SRAM cell in an SRAM cell array by a single sided write process in which a source node of an auxiliary driver transistor in a half-addressed SRAM cell is biased to a voltage level approximately equal to a voltage on a driver transistor in said half-addressed SRAM cell, said auxiliary driver transistor in said half-addressed SRAM cell having a drain node coupled to a bit-side data node of said half-addressed SRAM cell and a gate node coupled to a bit-bar-side data node of said half-addressed SRAM cell; and
    reading a data bit value from said addressed SRAM cell, where a source node of an auxiliary driver transistor in an addressed SRAM cell is biased to a voltage level approximately equal to a voltage on a driver transistor in said addressed SRAM cell, where said auxiliary driver transistor in said addressed SRAM cell has a drain node coupled to a bit-side data node of said addressed SRAM cell and a gate node coupled to a bit-bar-side data node of said addressed SRAM cell, and where said source node of said auxiliary driver transistor in said half-addressed SRAM cell is biased to a voltage level approximately equal to a voltage on said driver transistor in said half-addressed SRAM cell.

17. The process of claim 16, in which said step of writing a data bit value includes a step of floating said source node of said auxiliary driver transistor in said addressed SRAM cell.

18. The process of claim 16, further including a step of transitioning said addressed SRAM cell to a standby mode, by floating a source node of an auxiliary driver transistor of said addressed SRAM cell.

19. The process of claim 16, in which said step of writing said data bit value further includes the step of determining if said data bit value was successfully transferred to said bit-side data node of said addressed SRAM cell.

20. The process of claim 16, in which said step of reading said data bit value further includes a step of determining if a voltage level on said bit-side data node of said addressed SRAM cell was successfully transferred to a bit line of said addressed SRAM cell.

* * * * *